(12) United States Patent
Potera et al.

(10) Patent No.: US 12,446,300 B2
(45) Date of Patent: Oct. 14, 2025

(54) SEMICONDUCTOR DEVICES HAVING ON-CHIP GATE RESISTORS

(71) Applicant: Wolfspeed, Inc., Durham, NC (US)

(72) Inventors: Rahul R. Potera, Apex, NC (US); Prasanna Obala Bhuvanesh, Leander, TX (US); Shadi Sabri, Apex, NC (US); Roberto M. Schupbach, Fayetteville, AR (US); Jianwen Shao, Cary, NC (US)

(73) Assignee: Wolfspeed, Inc., Durham, NC (US)

( * ) Notice: Subject to any disclaimer, the term of this patent is extended or adjusted under 35 U.S.C. 154(b) by 679 days.

(21) Appl. No.: 17/847,410

(22) Filed: Jun. 23, 2022

(65) Prior Publication Data

US 2023/0420451 A1    Dec. 28, 2023

(51) Int. Cl.
| | | |
|---|---|---|
| *H10D 1/47* | (2025.01) | |
| *H01L 23/482* | (2006.01) | |
| *H10D 12/01* | (2025.01) | |
| *H10D 30/83* | (2025.01) | |
| *H10D 62/832* | (2025.01) | |
| *H10D 84/03* | (2025.01) | |
| *H10D 84/80* | (2025.01) | |

(52) U.S. Cl.
CPC ....... *H10D 84/811* (2025.01); *H01L 23/4824* (2013.01); *H10D 1/47* (2025.01); *H10D 12/031* (2025.01); *H10D 30/831* (2025.01); *H10D 62/8325* (2025.01); *H10D 84/035* (2025.01)

(58) Field of Classification Search
None
See application file for complete search history.

(56) References Cited

U.S. PATENT DOCUMENTS

| | | | |
|---|---|---|---|
| 11,664,436 B2 | 5/2023 | Ryu et al. | |
| 11,810,912 B2 | 11/2023 | Ji et al. | |
| 2008/0079081 A1* | 4/2008 | Hashimoto | H10D 30/668 |
| | | | 257/E29.255 |
| 2011/0227095 A1 | 9/2011 | Treu et al. | |
| 2013/0146972 A1* | 6/2013 | Rutter | H10D 84/83 |
| | | | 257/334 |
| 2019/0013311 A1* | 1/2019 | Losee | H10D 62/8325 |
| 2019/0096877 A1 | 3/2019 | Kudymov et al. | |
| 2022/0278212 A1* | 9/2022 | Ryu | H10D 84/141 |

OTHER PUBLICATIONS

"B. Weis, M. Braun and P. Friedrichs, "Turn-off and short circuit behaviour of 4H SiC JFETs," Conference Record of the 2001 IEEE Industry Applications Conference. 36th IAS Annual Meeting (Cat. No. 01CH37248), Chicago, IL, USA, 2001, pp. 365-369 vol. 1".
"Notification of Transmittal of the International Search Report and the Written Opinion of the International Searching Authority, or the Declaration for corresponding International Application No. PCT/US2023/025239, mailing date: Feb. 9, 2024 (26 pages)".
"Invitation to Pay Additional Fees and, Where Applicable, Protest Fee, for corresponding Application No. PCT/US2023/025239, dated Oct. 24, 2023, 13 pages".
"Bhalla et al., "Circuit Protection with SiC FETs in Dual-Gate Configuration" United SiC White Paper, Oct. 2021, 12 pgs".

* cited by examiner

*Primary Examiner* — Bilkis Jahan
(74) *Attorney, Agent, or Firm* — Myers Bigel, P.A.

(57) ABSTRACT

Power semiconductor devices comprise a gate pad, a gate bus, and a gate resistor that is electrically interposed between the gate pad and the gate bus and comprises a wide band-gap semiconductor material region.

19 Claims, 23 Drawing Sheets

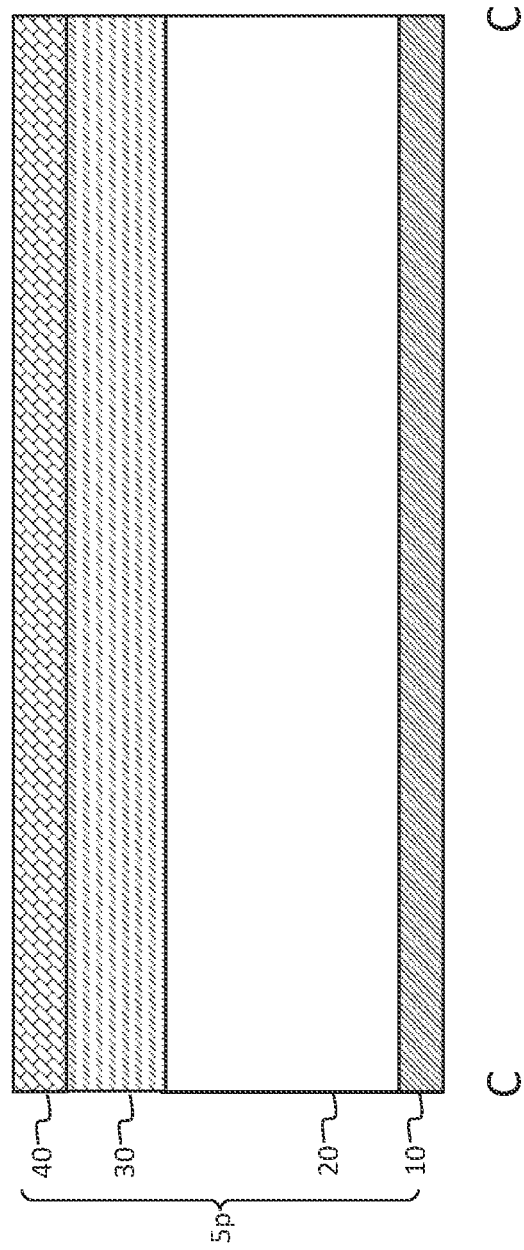

SEMICONDUCTOR DEVICES HAVING ON-CHIP GATE RESISTORS

FIELD

The present invention relates to semiconductor devices and, more particularly, to power semiconductor devices having gate resistors.

BACKGROUND

A wide variety of power semiconductor devices are known in the art including, for example, power Junction Field Effect Transistors ("JFETs"), power Metal Oxide Semiconductor Field Effect Transistors ("MOSFETs"), Insulated Gate Bipolar Transistors ("IGBTs") and various other devices. These power semiconductor devices are often fabricated from wide bandgap semiconductor materials such as silicon carbide or gallium nitride based materials. Herein, the term "wide bandgap semiconductor" encompasses any semiconductor having a bandgap of at least 1.4 eV. Power semiconductor devices are designed to selectively block or pass large voltages and/or currents. For example, in the blocking state, a power semiconductor device may be designed to sustain hundreds or thousands of volts of electric potential.

Many power semiconductor devices have gate structures. The gate structure may comprise, for example, a gate bond pad, a gate pad, a plurality of gate fingers in the active region of the device, and one or more gate buses that extend between the gate pad and the gate fingers. Gate-controlled power semiconductor devices can be turned on and off by applying different bias voltages to the gate structures thereof. The gate structure has a distributed gate resistance, which is a function of the length of the electrical path from the gate bond pad (or other gate terminal) to the gate finger of each individual unit cell, the lengths of the gate fingers, and the sheet resistance of the materials forming the gate structure. In many applications, it may be desirable to increase the amount of the gate resistance by, for example, adding one or more discrete or "lumped" gate resistors within the gate structure.

Power JFETs are typically normally-on devices, meaning that a JFET conducts current when a voltage of 0 volts is applied to the gate structure. A non-zero voltage (that exceeds some threshold level) is applied to the gate structure to turn the JFET off (i.e., to stop it from conducting). Power JFETs can be used in combination with normally-off MOSFETs (e.g., low voltage silicon MOSFETs) to form a normally-off integrated switch. For example, the JFET and the MOSFET may be in a cascode configuration to form such a switch. When power JFETs are used in a normally-off integrated switch, it may be desirable to increase the gate resistance, as the increased gate resistance may reduce voltage overshoots during switching transients by damping the gate-source loop of the JFET and may improve the behavior of the device in avalanche breakdown conditions. When power JFETs are cascoded with normally-off MOSFETs to be used as circuit breakers, the device remains on (conducting) until a fault condition is sensed, and the device is turned off to isolate the circuit. Accordingly, switching loss may be less important in this application since the device switches, not in normal operation, but only under fault conditions. Reducing turn-off time, however, may be significant, as it may reduce drain current and voltage overshoots during switching.

SUMMARY

Pursuant to some embodiments of the present invention, semiconductor devices are provided that comprise a gate pad, a gate bus and a gate resistor electrically interposed between the gate pad and the gate bus and comprising a wide band-gap semiconductor material region.

In some embodiments, the gate resistor has a first conductivity type and is a first portion of a semiconductor layer structure, the semiconductor layer structure further comprising a second portion that has a second conductivity type, the gate pad comprises a metal gate pad, and the gate bus comprises a metal gate bus, and the gate resistor electrically connects the metal gate pad to the metal gate bus.

In some embodiments, the wide band-gap semiconductor material region further comprises a first portion having the first conductivity type that is in between the metal gate pad and the second portion of the semiconductor layer structure and a second portion having the first conductivity type that is in between the metal gate bus and the second portion of the semiconductor layer structure.

In some embodiments, the metal gate pad comprises a first metal silicide region, the metal gate bus comprises a second metal silicide region, and the first and second metal silicide regions contact the first and second portions of the wide band-gap semiconductor material region, respectively, and the gate resistor comprises a third portion of the wide band-gap semiconductor material region, which is between the first and second portions of the wide band-gap semiconductor material region, and an upper surface of the gate resistor is devoid of a metal silicide.

In some embodiments, the first metal silicide region extends along a perimeter of a lower surface of the metal gate pad and defines an outer portion of the lower surface of the metal gate pad, and the lower surface of the metal gate pad further comprises an inner portion that abuts the first metal silicide region and is devoid of a metal silicide.

In some embodiments, the semiconductor devices further comprise a gate pad insulating pattern that is between the inner portion of the metal gate pad and the semiconductor layer structure.

In some embodiments, each of the first and second metal silicide regions comprises nickel silicide.

In some embodiments, the wide band-gap semiconductor material region comprises silicon carbide.

In some embodiments, the wide band-gap semiconductor material region is a portion of a semiconductor layer structure, and the semiconductor layer structure further comprises an active area comprising a plurality of junction field effect transistors (JFETs).

In some embodiments, the semiconductor device is cascoded with a metal-oxide-semiconductor field-effect transistor (MOSFET) to form a circuit breaker.

In some embodiments, an upper portion of the active area of the semiconductor layer structure comprises a plurality of gate trenches, and the plurality of JFETs comprise a plurality of metal gate contacts that are in the plurality of gate trenches, respectively.

In some embodiments, the wide band-gap semiconductor material region is a first wide band-gap semiconductor material region having a first conductivity type, and the semiconductor layer structure further comprises a plurality of second wide band-gap semiconductor material regions having the first conductivity type, and the plurality of JFETs further comprise a plurality of gate electrodes, each of which comprises a respective one of the plurality of second wide band-gap semiconductor material regions and contacts a lower surface of a respective one of the plurality of metal gate contacts.

In some embodiments, the semiconductor devices further comprise a source contact on the semiconductor layer structure and a plurality of gate insulating patterns, each of which separates a respective one of the plurality of metal gate contacts from the source contact.

In some embodiments, the wide band-gap semiconductor material region has sheet resistance in a range of about 14000 ohms/sq to about 22000 ohms/sq. For example, the wide band-gap semiconductor material region has sheet resistance of about 18000 ohms/sq.

In some embodiments, the gate resistor has a gate resistance in a range of about 5 ohms to about 50 ohms. For example, the gate resistor has a gate resistance of about 18 ohms.

Pursuant to some embodiments of the present invention, semiconductor devices are provided that comprise a semiconductor layer structure comprising an active area that comprises a plurality of junction field effect transistors (JFETs), a metal gate pad on the semiconductor layer structure and a metal gate bus on the semiconductor layer structure and electrically connected to the plurality of JFETs. The semiconductor layer structure further comprises a gate resistor that is electrically interposed between the metal gate pad and the metal gate bus.

In some embodiments, the gate resistor comprises a wide band-gap semiconductor material region.

In some embodiments, the wide band-gap semiconductor material region is a first wide band-gap semiconductor material region having a first conductivity type, and the semiconductor layer structure further comprises a plurality of second wide band-gap semiconductor material regions having the first conductivity type, and the plurality of JFETs comprise, respectively, a plurality of metal gate contacts and a plurality of gate electrodes, and each of the plurality of gate electrodes comprises a respective one of the plurality of second wide band-gap semiconductor material regions and contacts a lower surface of a respective one of the plurality of metal gate contacts.

In some embodiments, the plurality of JFETs comprise, respectively, a plurality of metal gate contacts. The semiconductor device further comprises a source contact on the semiconductor layer structure, and a plurality of gate insulating patterns, each of which separates a respective one of the plurality of metal gate contacts from the source contact.

In some embodiments, the semiconductor device is cascoded with a metal-oxide-semiconductor field-effect transistor (MOSFET) to form a circuit breaker.

In some embodiments, the gate resistor has a gate resistance in a range of about 5 ohms to about 50 ohms. For example, the gate resistor has a gate resistance of about 18 ohms.

In some embodiments, the gate resistor comprises a wide band-gap semiconductor material region having a first conductivity type and is a first portion of the semiconductor layer structure, and the semiconductor layer structure further comprises a second portion having a second conductivity type, and the wide band-gap semiconductor material region further comprises a first portion between the metal gate pad and the second portion of the semiconductor layer structure and a second portion between the metal gate bus and the second portion of the semiconductor layer structure.

In some embodiments, the metal gate pad comprises a first metal silicide region, the metal gate bus comprises a second metal silicide region, and the first and second metal silicide regions contact the first and second portions of the wide band-gap semiconductor material region, respectively, and the gate resistor comprises a third portion of the wide band-gap semiconductor material region that is between the first and second portions of the wide band-gap semiconductor material region, and an upper surface of the third portion of the wide band-gap semiconductor material region is devoid of a metal silicide.

In some embodiments, the first metal silicide region extends along a perimeter of a lower surface of the metal gate pad and defines an outer portion of the lower surface of the metal gate pad, and the lower surface of the metal gate pad further comprises an inner portion that abuts the first metal silicide region and is devoid of a metal silicide.

In some embodiments, the semiconductor devices further comprise a gate pad insulating pattern that is between the inner portion of the lower surface of the metal gate pad and the semiconductor layer structure.

In some embodiments, each of the first and second metal silicide regions comprises nickel silicide.

In some embodiments, the gate resistor comprises silicon carbide.

In some embodiments, the gate resistor comprises a wide band-gap semiconductor region having sheet resistance in a range of about 14000 ohms/sq to about 22000 ohms/sq. For example, the gate resistor comprises a wide band-gap semiconductor region having sheet resistance of about 18000 ohms/sq.

Pursuant to additional embodiments of the present invention, methods of forming a semiconductor device are provided. The methods comprise providing a preliminary semiconductor layer structure comprising a wide band-gap semiconductor material, the preliminary semiconductor layer structure comprising a source region in an upper portion thereof, a drift region and a channel region between the source region and the drift region, forming a trench in the source region and the channel region, forming a wide band-gap semiconductor material region having a first conductivity type in the channel region, the wide band-gap semiconductor material region defining a lower surface of the trench, and the first conductivity type being different from a second conductivity type of the channel region, forming a metal gate pad and a metal gate bus in the trench, wherein the metal gate pad and the metal gate bus are spaced apart from each other and contact a first portion and a second portion of the wide band-gap semiconductor material region, respectively, and forming an insulating pattern that contacts a third portion of the wide band-gap semiconductor material region, wherein the third portion of the wide band-gap semiconductor material region is between the first portion and the second portion thereof.

In some embodiments, forming the metal gate pad and the metal gate bus comprises forming a metal contact layer on the wide band-gap semiconductor material region, and removing a portion of the metal contact layer to expose the third portion of the wide band-gap semiconductor material region, thereby forming the metal gate pad and the metal gate bus.

In some embodiments, the methods further comprise performing an annealing process after removing the portion of the metal contact layer, thereby forming a first silicide region of the metal gate pad and a second metal silicide region of the metal gate bus.

In some embodiments, the metal gate pad is a lower portion of the metal gate pad, and the methods further comprise forming an upper portion of the metal gate pad on the lower portion of the metal gate pad.

In some embodiments, forming the metal gate pad and the metal gate bus comprises forming a gate pad insulating pattern on an inner portion of an upper surface of the wide band-gap semiconductor material region, forming a metal contact layer on the wide band-gap semiconductor material region and on the gate pad insulating pattern, the metal contact layer contacting an outer portion of the upper surface of the wide band-gap semiconductor material region, and removing a portion of the metal contact layer until the wide band-gap semiconductor material region is exposed, thereby forming the metal gate pad and the metal gate bus. The gate pad insulating pattern is provided in the metal gate pad.

In some embodiments, the methods further comprise performing an annealing process after removing the portion of the metal contact layer, thereby forming a first silicide region of the metal gate pad and a second metal silicide region of the metal gate bus.

In some embodiments, the trench is a first trench, and the wide band-gap semiconductor material region is a first wide band-gap semiconductor material region, and the methods further comprises forming a plurality of gate trenches in the source region and the channel region while forming the first trench, forming a plurality of second wide band-gap semiconductor material regions having the first conductivity type in the channel region while forming the first wide band-gap semiconductor material region, each of the plurality of second wide band-gap semiconductor material regions defining a lower surface of a respective one of the plurality of gate trenches, and forming a plurality of metal gate contacts in the plurality of gate trenches, respectively. The plurality of second wide band-gap semiconductor material regions contact the plurality of metal gate contacts, respectively.

In some embodiments, the methods further comprise forming a plurality of gate insulating patterns on the plurality of gate metal contacts, respectively, and forming a source contact on the plurality of gate insulating patterns.

Pursuant to some embodiments of the present invention, semiconductor devices are provided that comprise a semiconductor layer structure that comprises an active area comprising a plurality of junction field effect transistors (JFETs) and a metal gate pad on the semiconductor layer structure. The metal gate pad comprises a lower surface facing the semiconductor layer structure, and the metal gate pad comprises a metal silicide region that extends at least partially along a perimeter of the lower surface of the metal gate pad and defines an outer portion of the lower surface of the metal gate pad, and the lower surface of the metal gate pad further comprises an inner portion that abuts the metal silicide region and is devoid of a metal silicide.

In some embodiments, the semiconductor devices further comprise a gate pad insulating pattern that is between the inner portion of the lower surface of the metal gate pad and the semiconductor layer structure.

In some embodiments, the gate pad insulating pattern contacts the semiconductor layer structure.

In some embodiments, the metal gate pad extends on a side wall of the gate pad insulating pattern.

In some embodiments, the metal silicide region contacts the semiconductor layer structure.

In some embodiments, the semiconductor devices further comprise a metal gate bus on the semiconductor layer structure and electrically connected to the plurality JFETs. The semiconductor layer structure further comprises a gate resistor that is electrically interposed between the metal gate pad and the metal gate bus.

In some embodiments, the gate resistor comprises a wide band-gap semiconductor material region.

Pursuant to some embodiments of the present invention, semiconductor devices are provided that comprise a semiconductor layer structure that comprises an active area comprising a plurality of junction field effect transistors (JFETs), a metal gate pad on the semiconductor layer structure, and a gate pad insulating pattern in the metal gate pad.

In some embodiments, the gate pad insulating pattern contacts the semiconductor layer structure.

In some embodiments, the gate pad insulating pattern contacts an inner portion of an upper surface of the semiconductor layer structure, and the metal gate pad contacts an outer portion of the upper surface of the semiconductor layer structure.

In some embodiments, the metal gate pad extends on a side wall of the gate pad insulating pattern.

In some embodiments, the semiconductor devices further comprise a metal gate bus on the semiconductor layer structure and electrically connected to the plurality of JFETs. The semiconductor layer structure further comprises a gate resistor that is electrically interposed between the metal gate pad and the metal gate bus.

In some embodiments, the gate resistor comprises a wide band-gap semiconductor material region.

Pursuant to some embodiments of the present invention, semiconductor devices are provided that comprise a semiconductor layer structure comprising a wide band-gap semiconductor material region, a metal gate bus on the semiconductor layer structure, a field effect transistor comprising a metal gate contact that is on the semiconductor layer structure, and an inter-gate resistor that comprises a portion of the wide band-gap semiconductor material region and is electrically interposed between the metal gate bus and the metal gate contact.

In some embodiments, the wide band-gap semiconductor material region has a first conductivity type and is a first portion of the semiconductor layer structure, and the semiconductor layer structure further comprises a second portion having a second conductivity type, and the wide band-gap semiconductor material region further comprises a gate bus portion between the metal gate bus and the second portion of the semiconductor layer structure and a gate contact portion between the metal gate contact and the second portion of the semiconductor layer structure.

In some embodiments, the metal gate bus comprises a first metal silicide region, the metal gate contact comprises a second metal silicide region, and the first and second metal silicide regions contact the gate bus portion and the gate contact portion of the wide band-gap semiconductor material region, respectively, and the portion of the wide band-gap semiconductor material region is between the gate bus portion and the gate contact portion of the wide band-gap semiconductor material region, and an upper surface of the portion of the wide band-gap semiconductor material region is devoid of a metal silicide.

In some embodiments, each of the first and second metal silicide regions comprises nickel silicide.

In some embodiments, the wide band-gap semiconductor material region comprises silicon carbide.

In some embodiments, the field effect transistor is a junction field effect transistor.

In some embodiments, the semiconductor devices further comprise a source contact on the semiconductor layer structure, and a gate insulating pattern separates the metal gate contact from the source contact.

In some embodiments, the semiconductor devices further comprise a metal gate pad on the semiconductor layer structure, and a gate resistor electrically interposed between the metal gate pad and the metal gate bus.

In some embodiments, the inter-gate resistor comprises a first portion of the wide band-gap semiconductor material region, and the gate resistor comprises a second portion of the wide band-gap semiconductor material region.

In some embodiments, the wide band-gap semiconductor material region has sheet resistance in a range of about 14000 ohms/sq to about 22000 ohms/sq. For example, the wide band-gap semiconductor material region has sheet resistance of about 18000 ohms/sq In some embodiments, the wide band-gap semiconductor material region is one of a plurality of wide band-gap semiconductor material regions, the field effect transistor is one of a plurality of field effect transistors comprising a plurality of metal gate contacts, respectively, and the plurality of metal gate contacts are on the plurality of wide band-gap semiconductor material regions, respectively, and the inter-gate resistor is one of a plurality of inter-gate resistors, each of which is a portion of a respective one of the plurality of wide band-gap semiconductor material regions and is electrically interposed between the metal gate bus and a respective one of the plurality of metal gate contacts.

DETAILED DESCRIPTION

As noted above, many power semiconductor devices such as JFETs may include one or more lumped gate resistors that are designed to increase the gate resistance to desired values. These lumped gate resistors may also improve the electromagnetic interference ("EMI") performance of the device. Conventionally, lumped gate resistors are implemented by routing a current path for the gate signal through a higher resistance material, such as a semiconductor layer (as semiconductor materials have a higher sheet resistance than the metal that is used to form the metal gate pad and potentially other portions of the gate structure such as the metal gate bus). Lumped gate resistors are often implemented on a customer motherboard along the gate signal transmission path to a separate semiconductor chip mounted on the motherboard. It may be desirable however to incorporate the lumped gate resistor on the semiconductor chip, as it reduces part count. Furthermore, if this on-chip gate resistance is lumped and equally "seen" across the chip, then it may not cause imbalances between different parts of the chip.

According to some embodiments of the present invention, a semiconductor device (e.g., a power JFET device) may include an "on-chip" lumped gate resistor. Specifically, a lumped gate resistor may be provided between a gate pad and a gate bus of the device. Further, according to some embodiments of the present invention, the lumped gate resistor may be formed using the sheet resistance of an implanted region (e.g., p++ region) that is already included in conventional power JFET devices. Accordingly, lumped gate resistors according to some embodiments of the present invention may add marginal overhead area to the chip and may be formed by processes that already exist for conventional power JFET devices.

Figure 1:
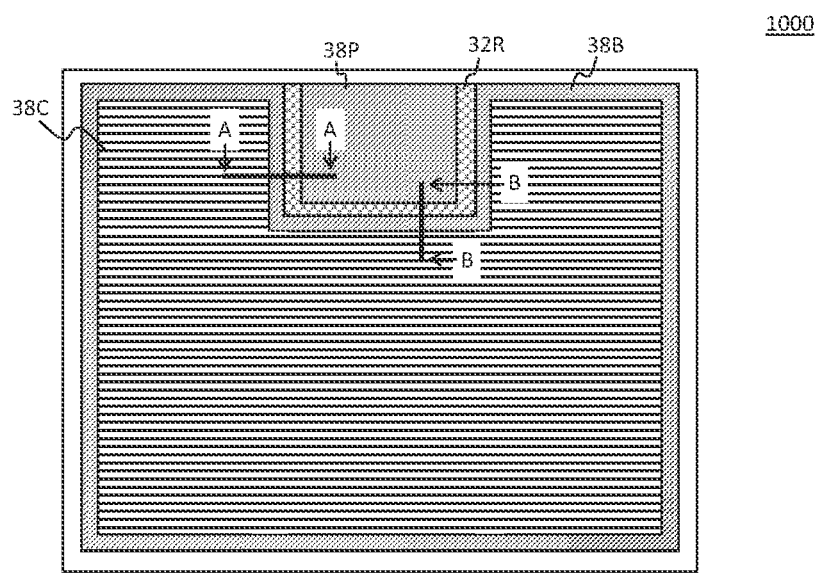
FIG. 1 is a schematic plan view of a power semiconductor device according to embodiments of the present invention.
Figure 2A:
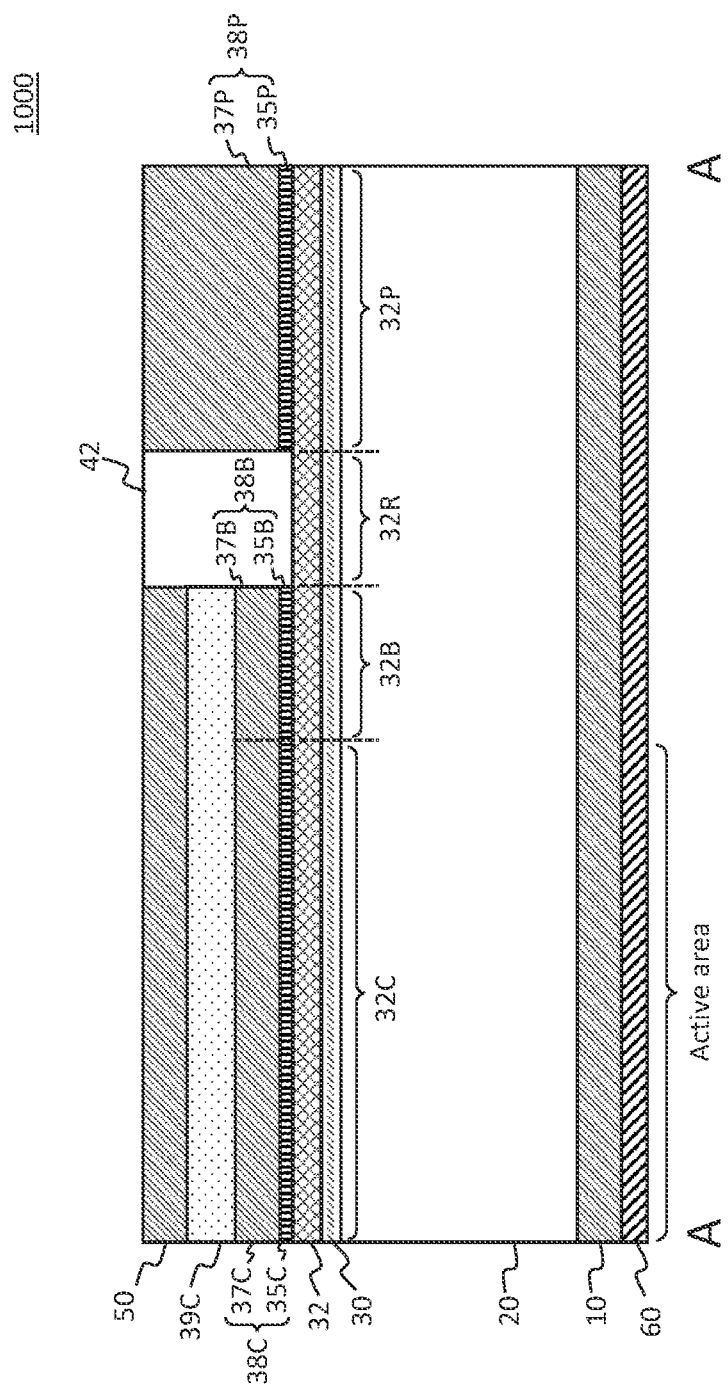
FIGS. 2A and 2B are schematic cross-sectional diagrams taken along lines A-A and B-B of FIG. 1, respectively.
Figure 2B:
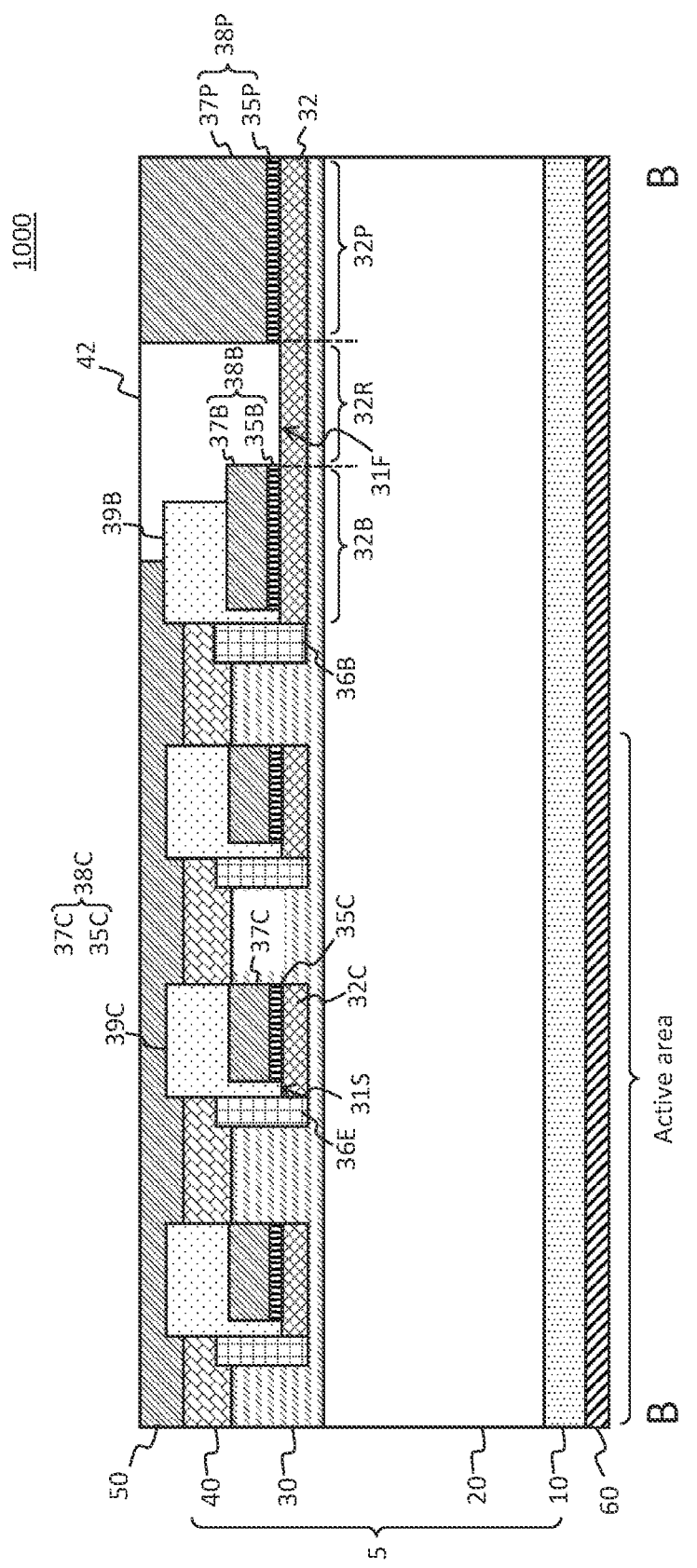

FIG. 1 is a schematic plan view of a power semiconductor device 1000 with several elements thereof (e.g., a source contact 50 and gate insulating patterns 39B and 39C in FIGS. 2A and 2B) omitted. FIGS. 2A and 2B are schematic cross-sectional diagrams taken along lines A-A and B-B of FIG. 1, respectively.

Referring to FIGS. 1-2B, the power semiconductor device 1000 includes a semiconductor layer structure 5 (FIG. 2B), a metal gate pad 38P, a metal gate bus 38B, and a metal gate contact 38C, which are provided on the semiconductor layer structure 5. The metal gate pad 38P and the metal gate bus 38B may be spaced apart from each other, and the power semiconductor device 1000 may also include a lumped gate resistor 32R that is electrically interposed between the metal gate pad 38P and the metal gate bus 38B. The gate resistor 32R may have a gate resistance in a range of about 5 ohms to about 50 ohms (e.g., 15.5 ohms to about ohms) in example embodiments. For example, the gate resistor 32R may have a gate resistance of about 18 ohms. It will be appreciated, however, that the gate resistance value may be adjusted based on the application.

The semiconductor layer structure 5 may include a substrate 10, a drift region a channel region 30, source regions 40, wide band-gap semiconductor material regions 32, and gate electrode regions 36B and 36E. The substrate 10 may be formed of wide bandgap semiconductor materials (e.g., may be a silicon carbide substrate) and may be heavily doped with n-type (n+) dopants in an example embodiment. The drift region 20 may be provided on an upper surface of the substrate 10. The drift region 20 may be formed of wide bandgap semiconductor materials (e.g., may be an epitaxially grown silicon carbide layer) and may be a lightly-doped n-type (n) region. For example, the drift region 20 may be a lightly-doped n-type (n) silicon carbide drift region. The drift region 20 may have, for example, a doping concentration of $1\times10^{14}$ to $5\times10^{16}$ dopants/cm$^3$. The drift region 20 may be a thick region, having a vertical height above the substrate 10 of, for example, 3-100 microns. While not shown in FIGS. 2A and 2B, in some embodiments an upper portion of the drift region 20 may be more heavily doped (e.g., a doping concentration of $1\times10^{16}$ to $1\times10^{17}$ dopants/cm$^3$) than the lower portion thereof to provide a current spreading layer in the upper portion of the drift region 20.

The channel region 30 may be provided on an upper surface of the drift region 20. The channel region 30 may be formed of wide bandgap semiconductor materials (e.g., silicon carbide) and may be an n-type (n) region. For example, the channel region 30 may be an n-type silicon carbide channel region. The channel region 30 may have a doping concentration higher than that of the drift region 20 and may have, for example, a doping concentration of $1\times10^{16}$ to $1\times10^{17}$ dopants/cm$^3$.

The source regions 40 may be provided on an upper surface of the channel region 30. The source regions 40 may be formed of wide bandgap semiconductor materials (e.g., silicon carbide) and may be heavily-doped n-type (n+) regions. For example, the source regions may be heavily-doped n-type (n+) silicon carbide source regions 40. The source regions 40 may have a doping concentration higher than that of the channel region 30 and may have, for example, a doping concentration of $1\times10^{19}$ to $5\times10^{20}$ dopants/cm$^3$.

The wide band-gap semiconductor material regions 32 may be provided in the channel region 30. The wide band-gap semiconductor material regions 32 may be formed of wide bandgap semiconductor materials (e.g., silicon carbide) and may be heavily-doped p-type (p++) regions. For example, the wide band-gap semiconductor material regions 32 may be heavily-doped p-type (p++) silicon carbide wide band-gap semiconductor material regions 32. The wide band-gap semiconductor material regions 32 may have, for example, a doping concentration of $1\times10^{19}$ to $5\times10^{20}$ dopants/cm$^3$ The gate electrode regions 36E and 36B may be provided in the channel region and contact the wide band-gap semiconductor material regions 32. The gate electrode regions 36E and 36B may be formed of wide bandgap semiconductor materials (e.g., silicon carbide) and may be heavily-doped p-type (p+) regions. For example, the gate electrode regions 36E and 36B may be heavily-doped p-type (p+) silicon carbide gate electrode regions 36E and 36B. The gate electrode regions 36E and 36B may have a doping concentration lower than that of the wide band-gap semiconductor material regions 32 and may have, for example, a doping concentration of $1\times10^{17}$ to $5\times10^{20}$ dopants/cm$^3$.

In some embodiments, the drift region 20, the channel region 30, the source regions 40, the wide band-gap semiconductor material regions 32, and the gate electrode regions 36 may be formed by performing, for example, an epitaxial growth process using the substrate as a seed layer and then performing ion implantation processes.

The wide band-gap semiconductor material region 32 may have a sheet resistance in a range of about 14000 ohms/sq to about 22000 ohms/sq in example embodiments. A single wide band-gap semiconductor material region 32 may include a gate pad portion 32P, a gate bus portion 32B, a gate contact portion 32C, and a gate resistor 32R as illustrated in FIG. 2A.

The gate pad portion 32P may be between the channel region 30 and the metal gate pad 38P and may contact both the channel region 30 and the metal gate pad 38P. The gate bus portion 32B may be between the channel region 30 and the metal gate bus 38B and may contact both the channel region 30 and the metal gate bus 38B. The gate contact portion 32C may be between the channel region 30 and the metal gate contact 38C and may contact both the channel region 30 and the metal gate contact 38C.

The metal gate pad 38P and the gate pad portion 32P may together comprise a gate pad, and the metal gate bus 38B and the gate bus portion 32B may together comprise a gate bus. The metal gate contact 38C, the gate contact portion 32C and the electrode region 36E may together comprise a gate of a unit cell JFET. As the drift region 20, the channel region 30 and the source region 40 have the same conductivity type (e.g., n-type), the JFET is normally on and is turned off when a sufficient negative gate bias is applied to the gate thereof.

The power semiconductor device 1000 may include multiple unit cell JFETs provided in an active area of the semiconductor layer structure 5. An upper portion of the semiconductor layer structure 5 may include a first trench 31F and second trenches 31S. The metal gate pad 38P and the metal gate bus 38B may be provided in the first trench 31F, and the metal gate contacts 38C may be provided in the second trenches 31S, respectively.

The metal gate pad 38P may include a first metal silicide region 35P and a metal pad region 37P sequentially stacked on the gate pad portion 32P. The metal gate bus 38B may include a second metal silicide region 35B and a metal bus region 37B sequentially stacked on the gate bus portion 32B. An upper surface of the gate pad portion 32P may contact the first metal silicide region 35P, and an upper surface of the gate bus portion 32B may contact the second metal silicide region 35B. The metal gate contact 38C may include a third metal silicide region 35C and a metal contact region 37C sequentially stacked on the gate contact portion 32C. An upper surface of the gate contact portion 32C may contact the third metal silicide region 35C.

The gate pad portion 32P and the first metal silicide region 35P, the gate bus portion 32B and the second metal silicide region 35B, and the gate contact portion 32C and the third metal silicide region 35C may form low resistance ohmic contacts that have a sheet resistance between 2 to 5 ohms/sq.

The first, second and third metal silicide regions 35P, 35B and 35C may be formed of metal silicide (e.g., nickel silicide, tungsten silicide, titanium silicide or molybdenum silicide). In some embodiments, the first, second and third metal silicide regions 35P, 35B and may be formed of nickel silicide. The metal pad region 37P, the metal bus region 37B, and the metal contact region 37C may be formed of metal (e.g., aluminum, tungsten, nickel, titanium, ruthenium and/ or an alloy thereof).

The gate resistor 32R may be electrically interposed between the gate pad and the gate bus (e.g., between the metal gate pad 38P and the metal gate bus 38B), and a current flowing between the gate pad and the gate bus may flow through the gate resistor 32R. An upper surface of the gate resistor 32R may be devoid of a silicide region.

The power semiconductor device 1000 may also include gate insulating patterns 39B and 39C. The gate insulating patterns 39B and 39C may be provided on the metal gate bus 38B and the metal gate contact 38C, respectively. Each of the gate insulating patterns 39B and 39C may comprise, for example, one or more dielectric materials such as silicon oxide, silicon nitride, silicon oxynitride or the like.

A source contact 50 may be provided on the source region 40 and the gate insulating patterns 39B and 39C. The source contact 50 may include one or more layers such as, for example, a diffusion barrier layer and a bulk metal layer. The gate insulating patterns 39B and 39C may separate the metal gate bus 38B and the metal gate contact 38C from the source contact 50.

An insulating pattern 42 may be provided on the gate resistor 32R and between the metal gate pad 38P and the source contact 50. In some embodiments, the insulating pattern 42 may contact an upper surface of the gate resistor 32R. The insulating pattern 42 may include multiple layers sequentially stacked on the gate resistor 32R. In some embodiments, the insulating pattern 42 may include a dielectric layer (e.g., a silicon oxide layer, a silicon nitride layer, an aluminum oxide layer, a magnesium oxide layer and/or a silicon oxy-nitride layer) and a protective layer (e.g., a polyimide layer).

A drain pad 60 may be provided on the bottom side of the power semiconductor device 1000. The drain pad 60 may be connected to an underlying submount such as a lead frame, a heat sink, a power substrate or the like via soldering, brazing, direct compression or the like.

Figure 3:
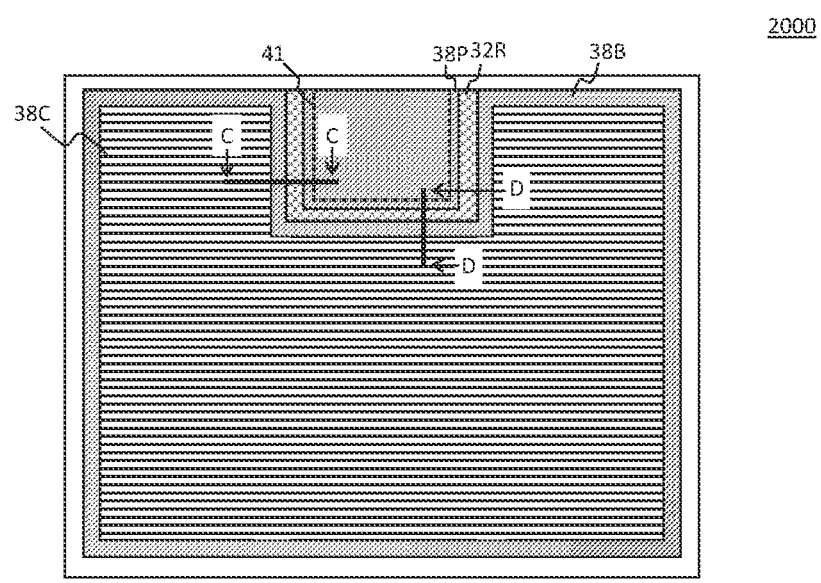
FIG. 3 is a schematic plan view of a power semiconductor device according to embodiments of the present invention.
Figure 4A:
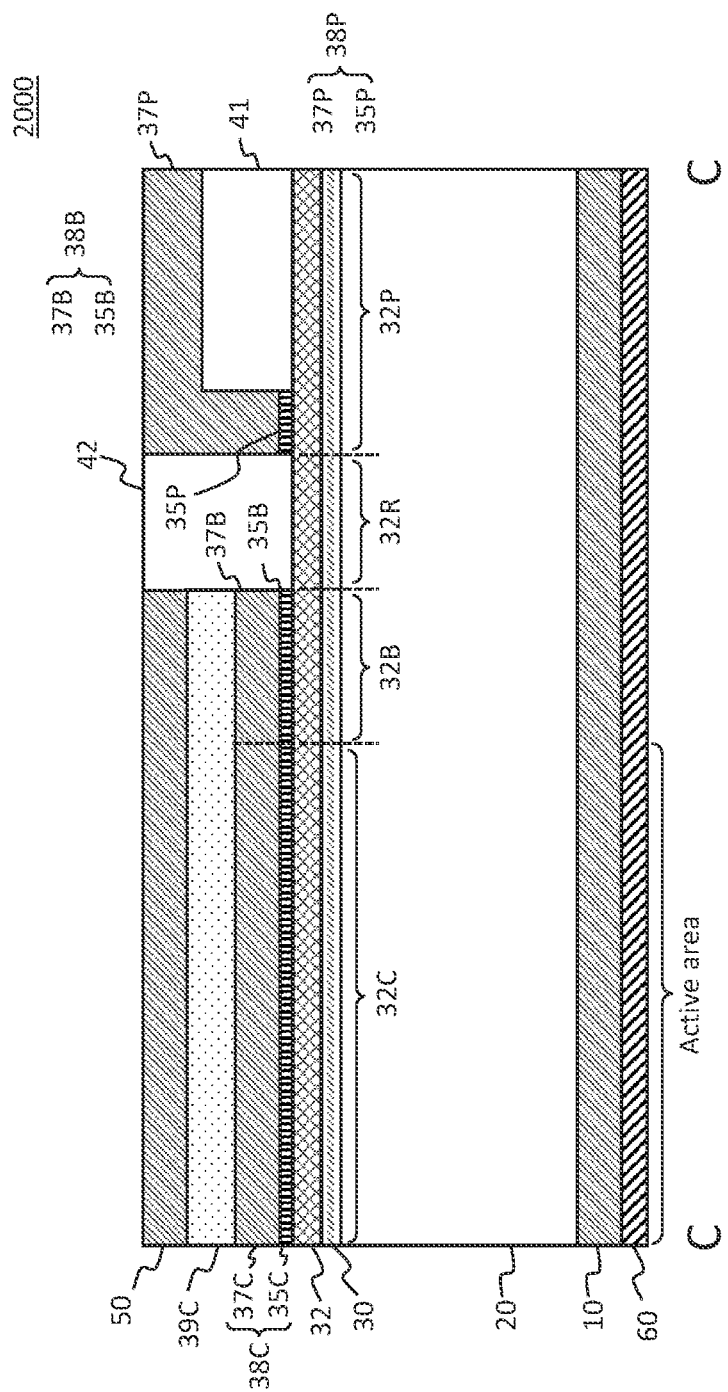
FIGS. 4A and 4B are schematic cross-sectional diagrams taken along lines C-C and D-D of FIG. 3, respectively.
Figure 4B:
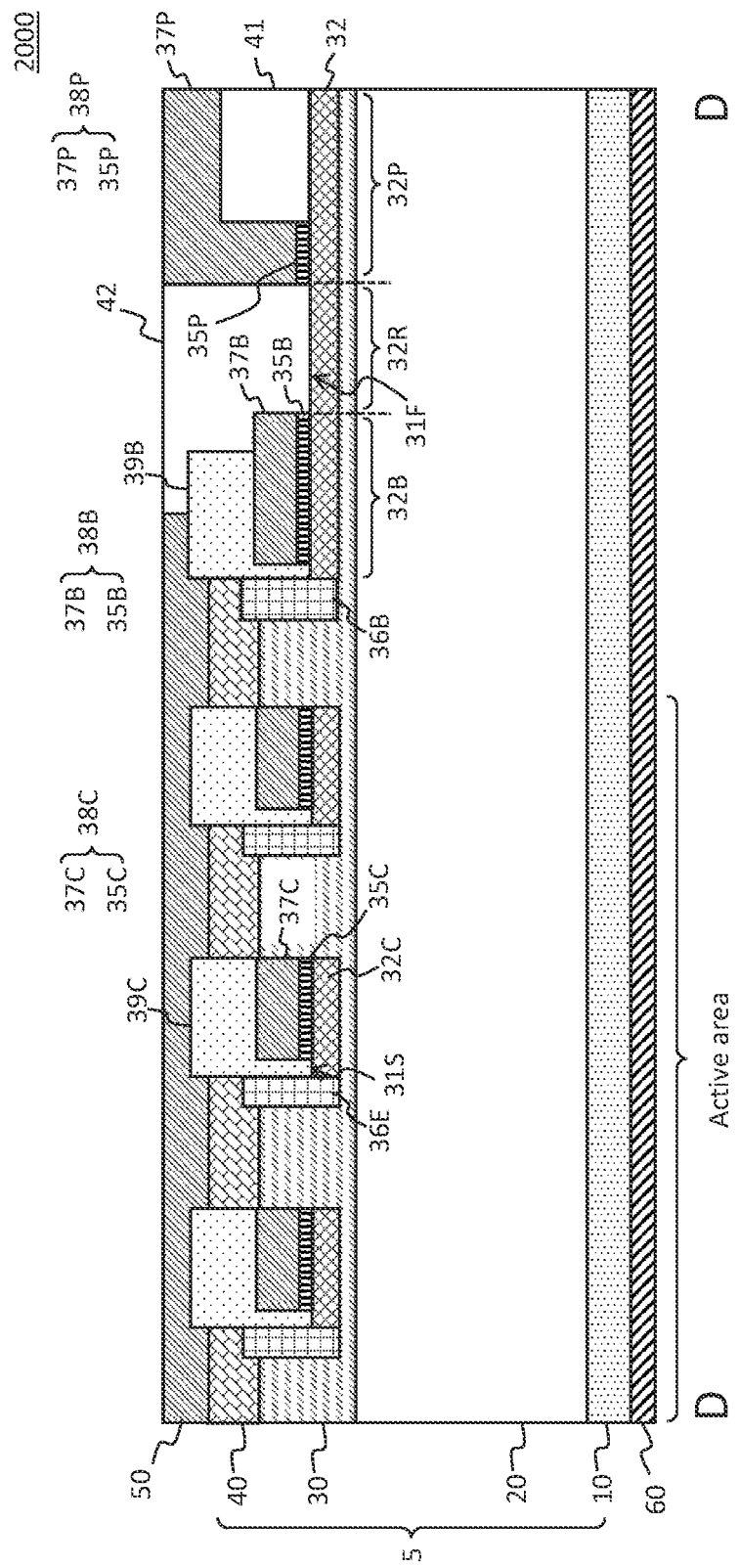

FIG. 3 is a schematic plan view of a power semiconductor device 2000 with several elements thereof (e.g., a source contact 50 and gate insulating patterns 39B and 39C in FIGS. 4A and 4B) omitted. FIGS. 4A and 4B are schematic cross-sectional diagrams taken along lines C-C and D-D of FIG. 3, respectively.

As can be seen, the power semiconductor device 2000 may be very similar to the power semiconductor device 1000, with the primary difference being that a gate pad insulating pattern 41 may be provided in the metal gate pad 38P. The gate pad insulating pattern 41 may be provided between an inner portion of a lower surface of the metal gate pad 38P and an inner portion of an upper surface of the gate pad portion 32P of the wide band-gap semiconductor material region 32. The gate pad insulating pattern 41 may contact the inner portion of the lower surface of the metal gate pad 38P and the inner portion of the upper surface of the gate pad portion 32P. The metal gate pad 38P may extend on a side wall of the gate pad insulating pattern 41. In some embodiments, the metal gate pad 38P may enclose the side wall of the gate pad insulating pattern 41 and may contact the side wall of the gate pad insulating pattern 41.

The first metal silicide region 35P may extend along a perimeter of lower surface of the metal gate pad 38P and may define an outer portion of the lower surface of the metal gate pad 38P. The inner portion of the lower surface of the metal gate pad 38P may be devoid of a metal silicide. The first metal silicide region 35P may contact an outer portion of the upper surface of the gate pad portion 32P.

Figure 5:
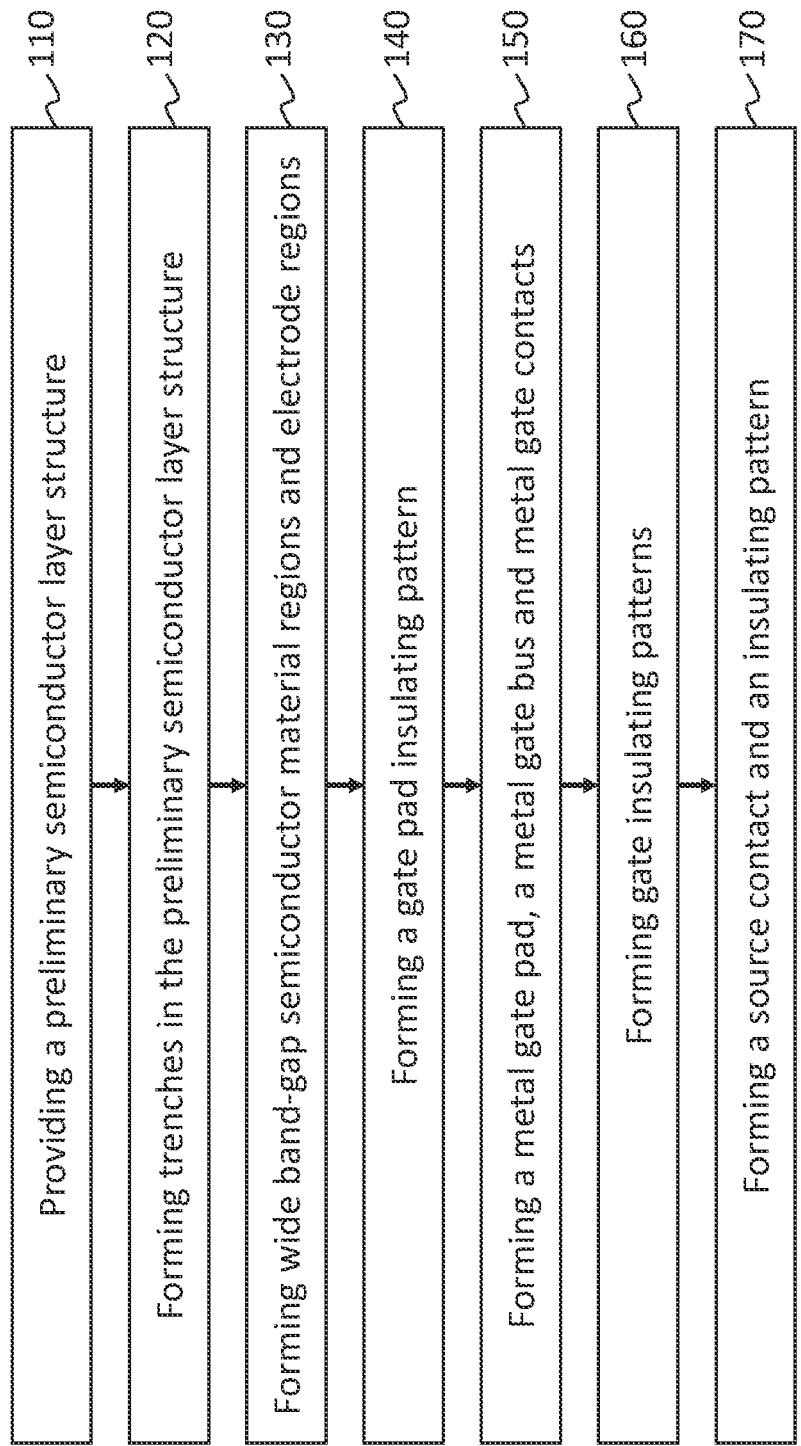
FIG. 5 is a flow chart illustrating methods of fabricating a power semiconductor device according to embodiments of the present invention.

FIG. 5 is a flow chart illustrating methods of fabricating the power semiconductor device 2000 according to some embodiments of the present invention. FIGS. 6A, 7A, 8A, 9A, 10A, 11A and 12A are cross-sectional diagrams taken along line C-C of FIG. 3 and FIGS. 6B, 7B, 8B, 9B, 10B, 11B and 12B are cross-sectional diagrams taken along line D-D of FIG. 3 illustrating methods of fabricating the power semiconductor device 2000 according to some embodiments of the present invention.

Figure 6B:
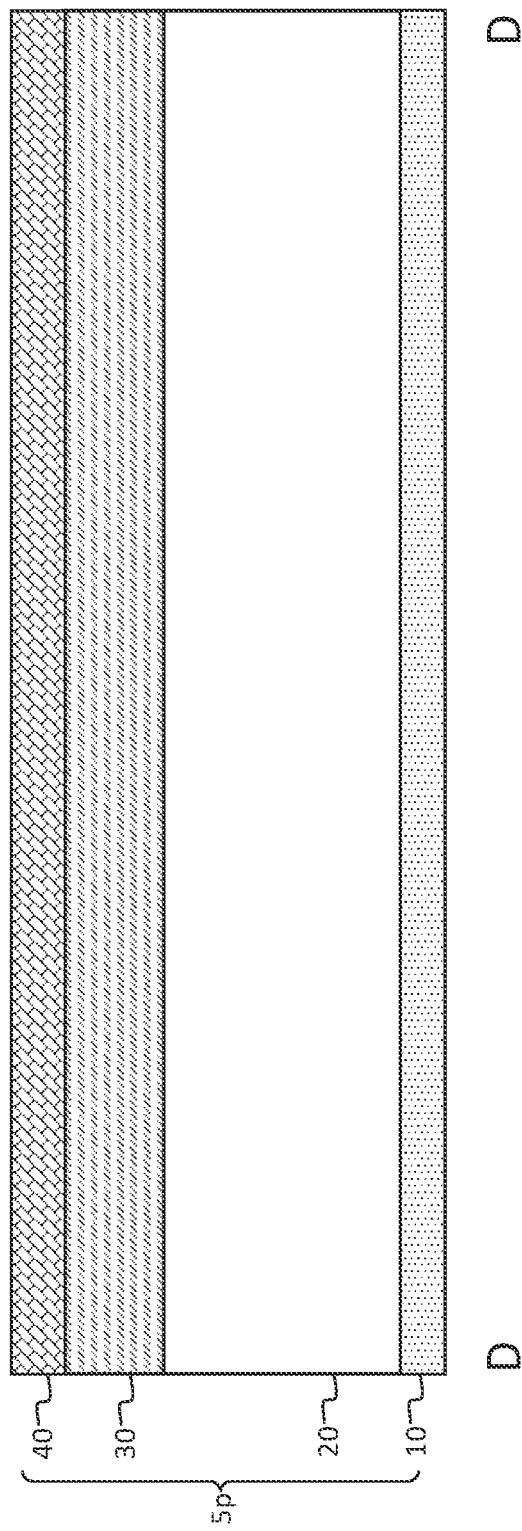
FIGS. 6A, 7A, 8A, 9A, 10A, 11A and 12A are cross-sectional diagrams taken along line C-C of FIG. 3 and FIGS. 6B, 7B, 8B, 9B, 10B, 11B and 12B are cross-sectional diagrams taken along line D-D of FIG. 3 illustrating methods of fabricating a power semiconductor device according to embodiments of the present invention.

Referring to FIGS. 5, 6A and 6B, the methods may include providing a preliminary semiconductor layer structure 5p (Block 110). The preliminary semiconductor layer structure 5p may include a substrate 10, a drift region 20, a channel region 30 and a source region 40. The drift region 20, the channel region 30 and the source region 40 may be formed by, for example, performing an epitaxial growth processing using the substrate 10 as a seed layer and then performing ion implantation processes.

Figure 7A:
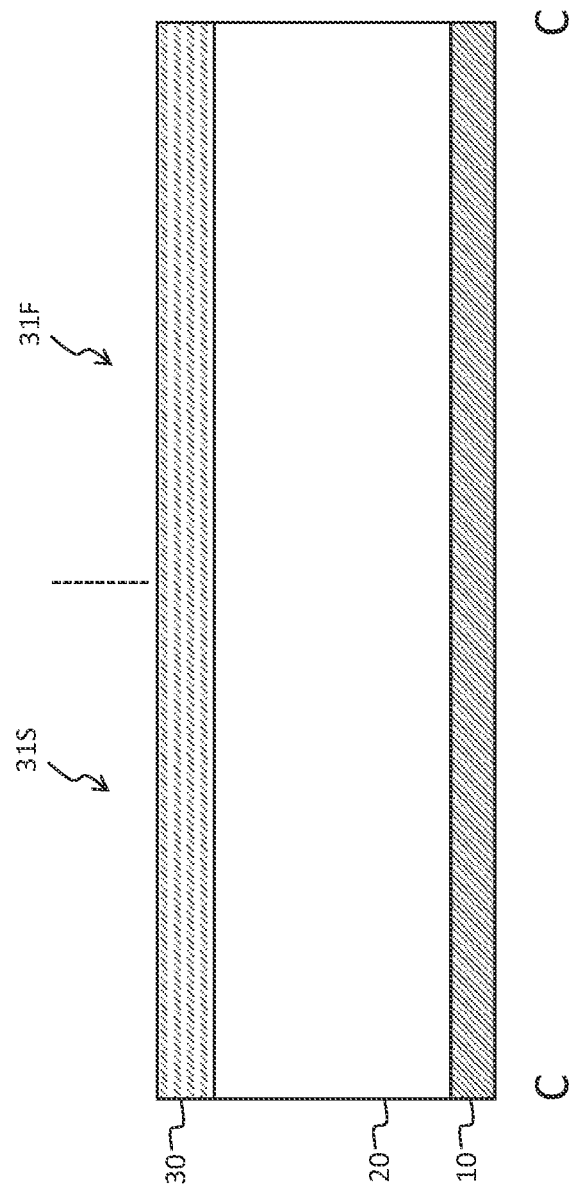
Figure 7B:
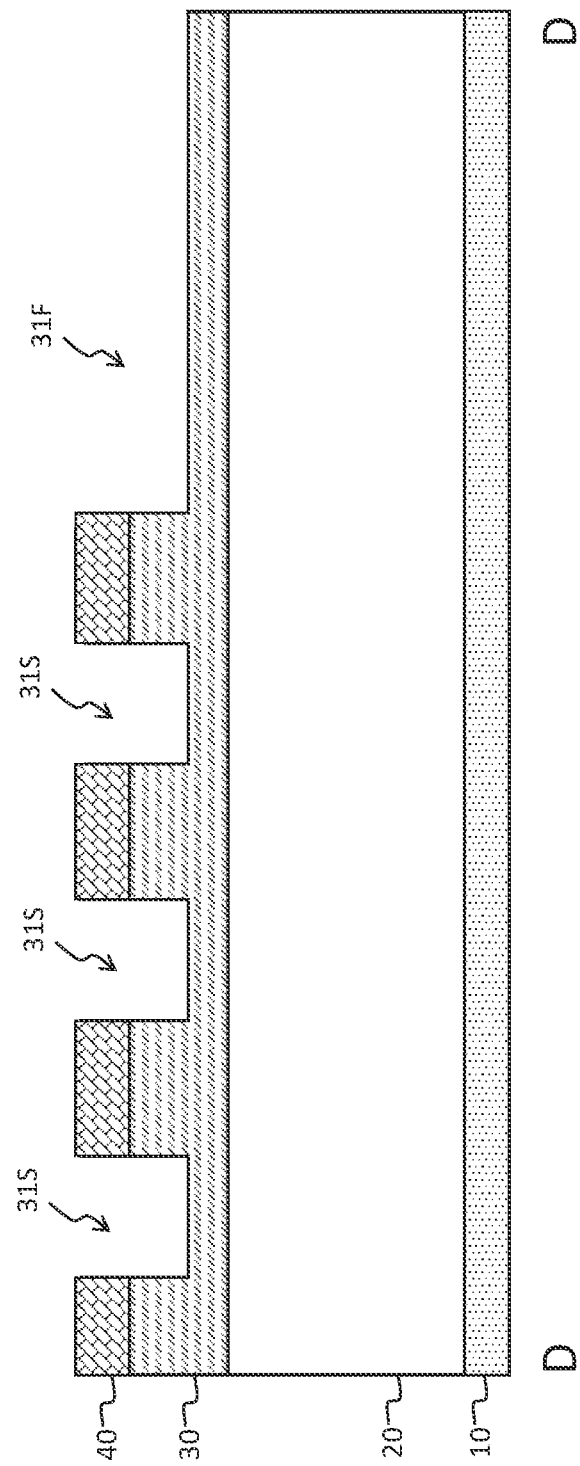

Referring to FIGS. 5, 7A and 7B, the methods may also include forming a first trench 31F and second trenches 31S in the preliminary semiconductor layer structure 5p (Block 120). The first trench 31F and the second trenches 31S may be formed by etching the preliminary semiconductor layer structure 5p. The first trench 31F and the second trenches 31S may extend through the source region 40 and may be formed in the channel region 30. The channel region 30 may define lower surfaces of the first trench 31F and the second trenches 31S.

Figure 8A:
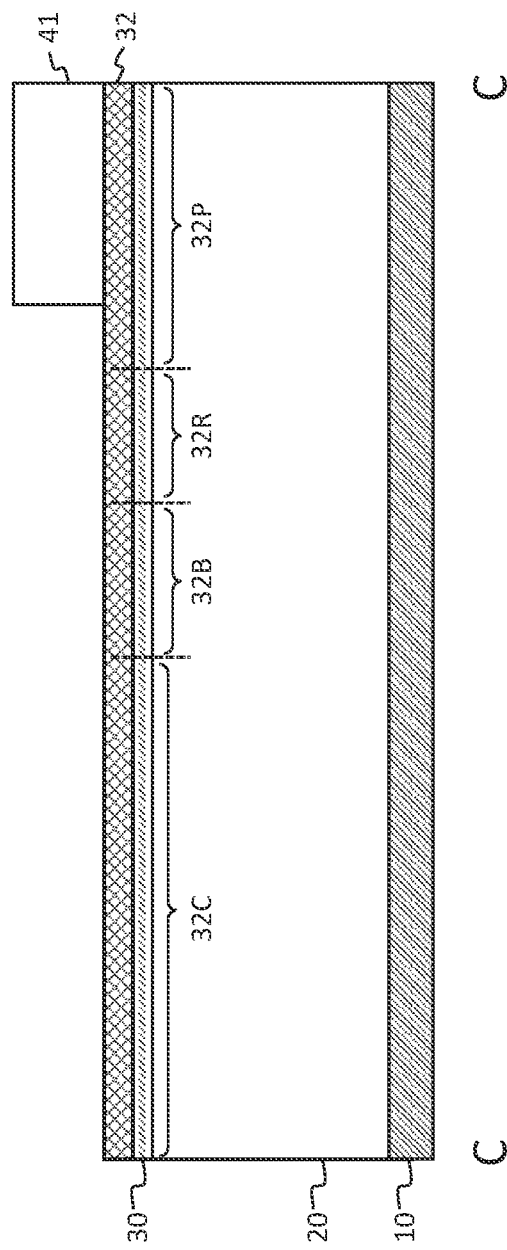
Figure 8B:
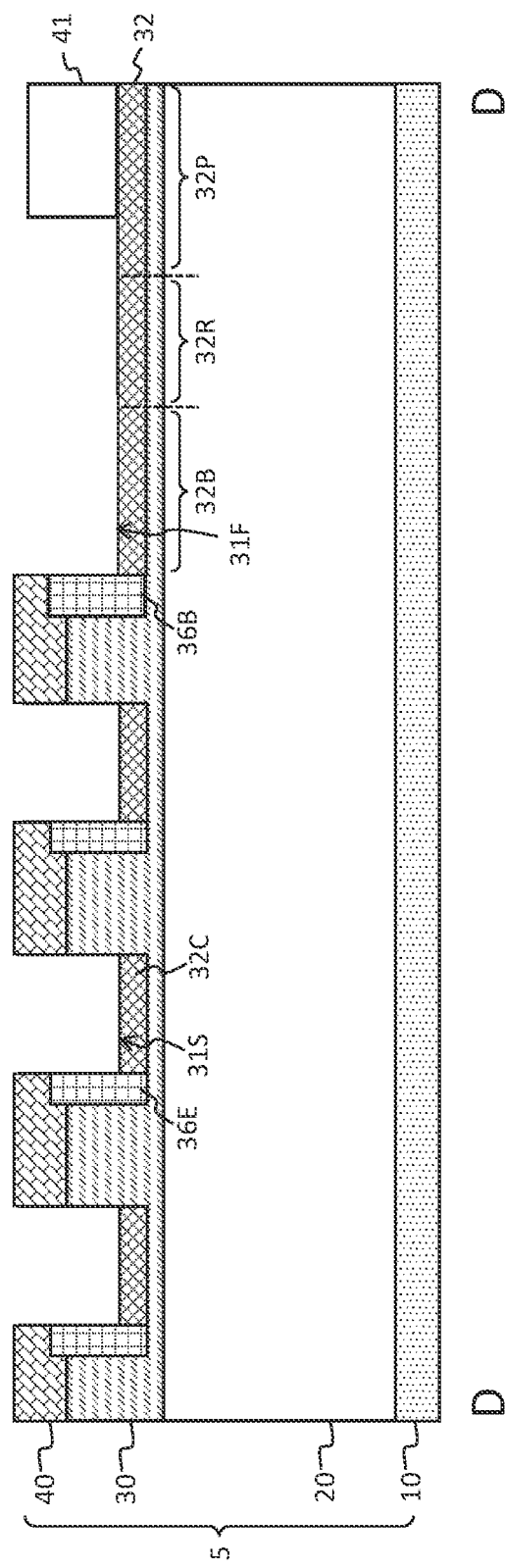

Referring to FIGS. 5, 8A and 8B, wide band-gap semiconductor regions 32 and gate electrode regions 36B and 36E may be formed in the channel region 30 (Block 130). In some embodiments, the wide band-gap semiconductor regions 32 may be formed by implanting impurities in the channel region 30 through the lower surfaces of the first trench 31F and the second trenches 31S, and the gate electrode regions 36B and 36E may be formed by implanting impurities in the channel region 30 through side surfaces of the first trench 31F and the second trenches 31S.

After the wide band-gap semiconductor regions 32 and the gate electrode regions 36B and 36E are formed, a gate pad insulating pattern 41 may be formed on the wide band-gap semiconductor region 32 (Block 140). The gate pad insulating pattern 41 may be formed on an inner portion of an upper surface of the gate pad portion 32P of the wide band-gap semiconductor region 32 and may not cover an outer portion of the upper surface of the gate pad portion 32P. The gate pad insulating pattern 41 may contact the inner portion of the upper surface of the gate pad portion 32P.

Referring to FIG. 5, a lower portion of a metal gate pad 38P, a metal gate bus 38B, and metal gate contacts 38C may be formed on the wide band-gap semiconductor regions 32 (Block 150). In some embodiments, the lower portion of the metal gate pad 38P, the metal gate bus 38B and the metal gate contacts 38C may be formed by processes illustrated in FIGS. 9A, 9B, 10A and 10B.

Figure 9A:
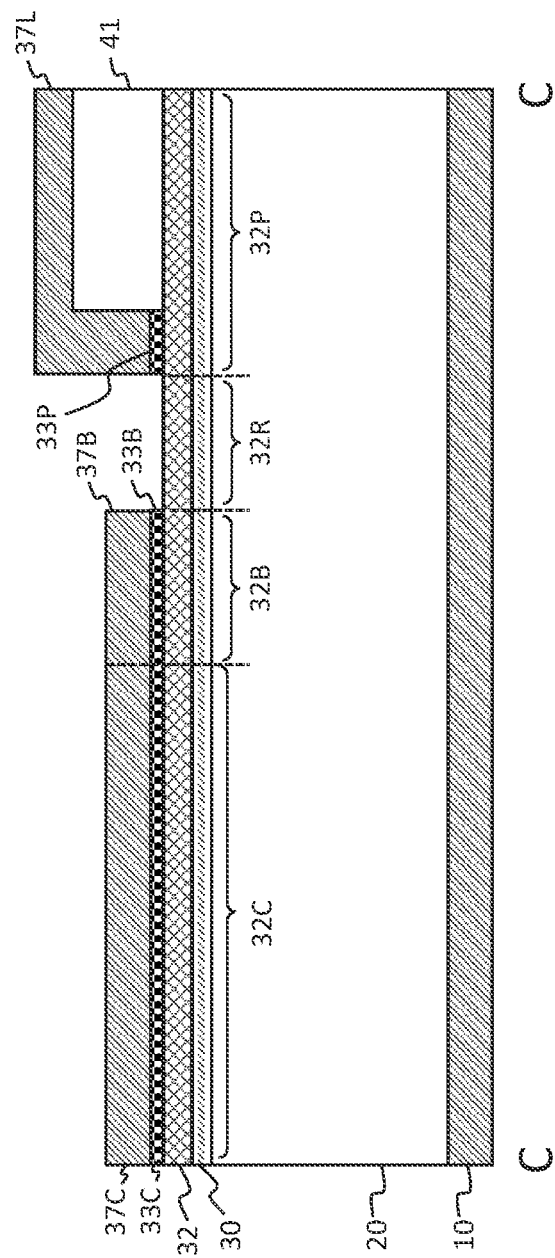
Figure 9B:
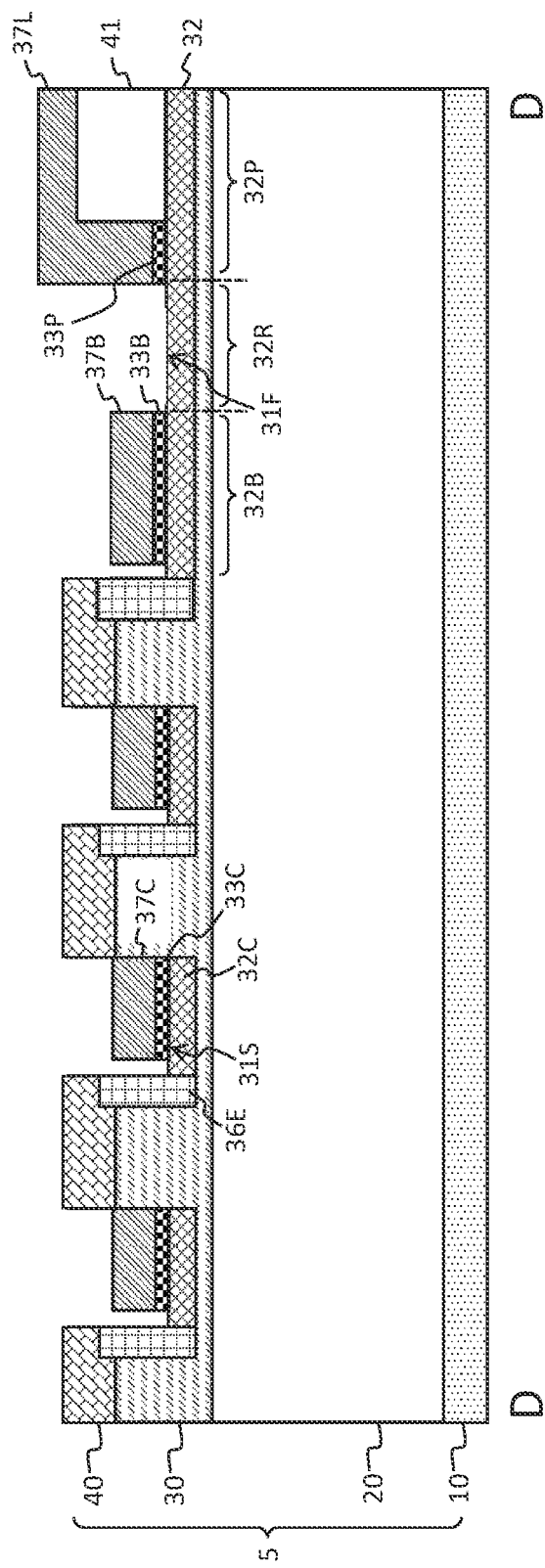

Referring to FIGS. 9A and 9B, forming the lower portion of the metal gate pad 38P, the metal gate bus 38B and the metal gate contacts 38C may include forming a metal contact layer and a metal layer on the wide band-gap semiconductor regions 32 and on the gate pad insulating pattern 41 and then forming metal contact patterns 33P, 33B and 33C by removing portions of the metal contact layer and forming metal regions 37L, 37B and 37C by removing portions of the metal layer. The metal contact layer may be a metal layer (e.g., a nickel layer, a tungsten layer, a titanium layer or a molybdenum layer). The metal region 37L may be a lower portion of the metal pad region (e.g., the metal pad region 37P in FIG. 4A).

A portion of the metal contact layer and a portion of the metal layer formed on an upper surface of a resistor 32R may be removed, thereby exposing the upper surface of the resistor 32R. Therefore, a metal silicide may not be formed on the upper surface of the resistor 32R through a subsequent annealing process, and the upper surface of the resistor 32R may be devoid of a metal silicide.

Figure 10A:
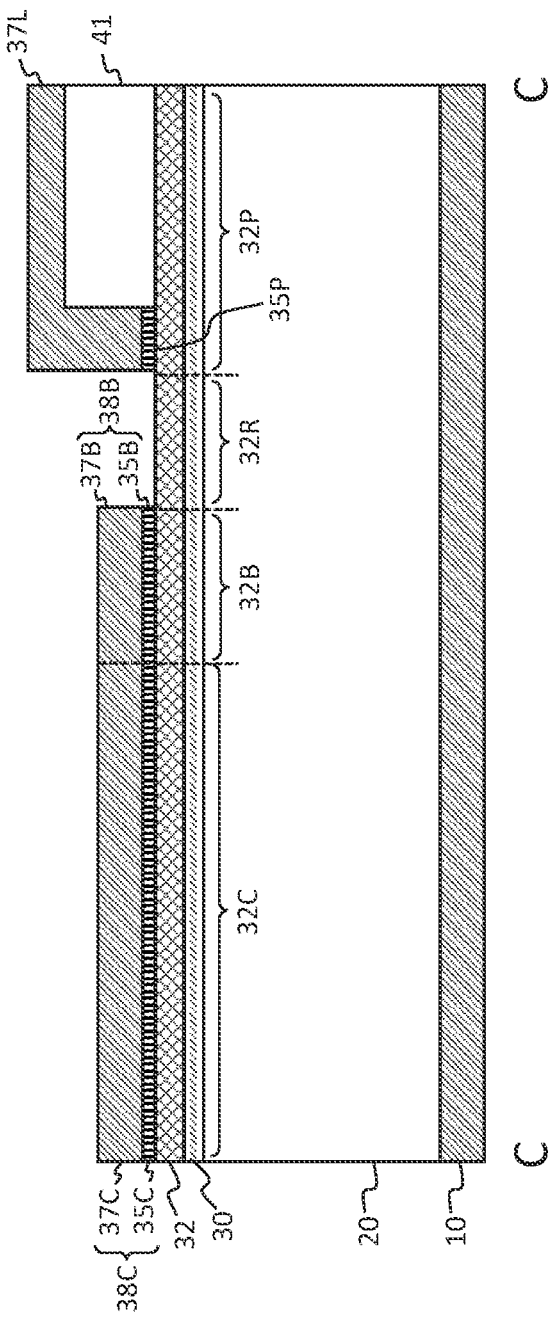
Figure 10B:
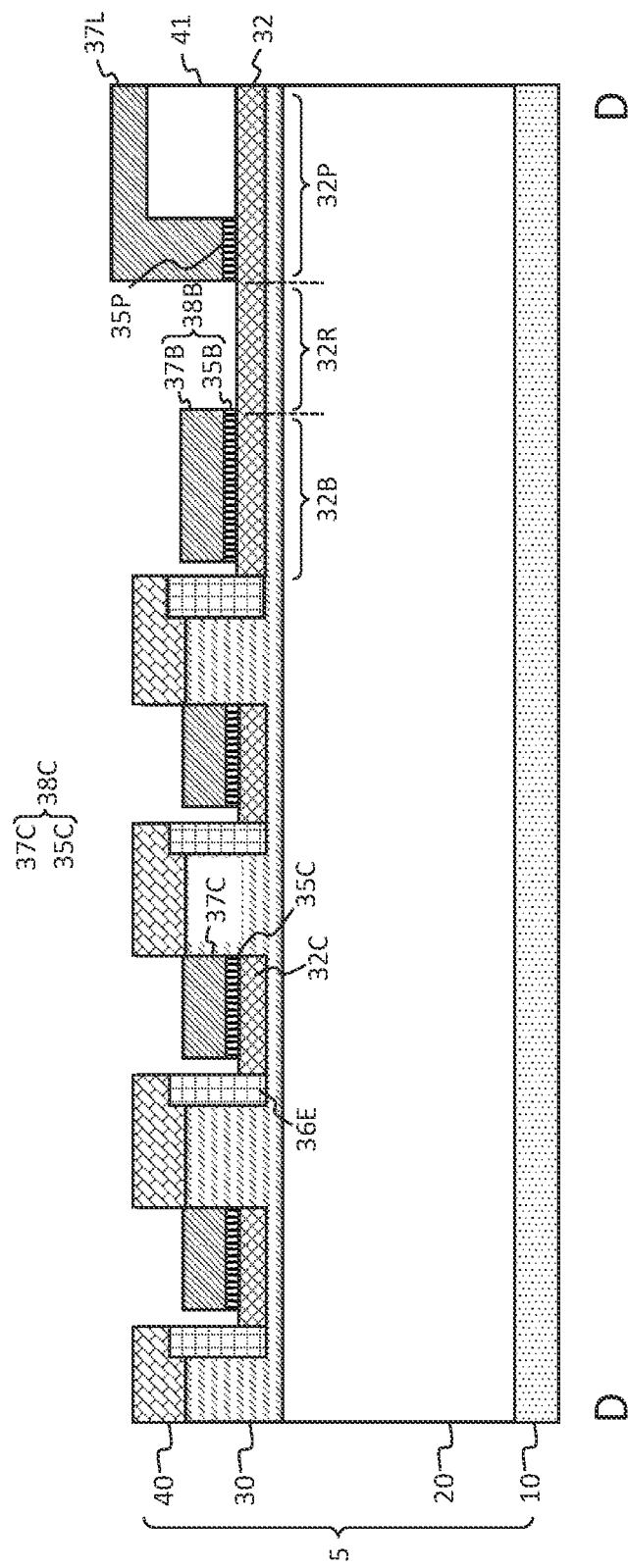

Referring to FIGS. 10A and 10B, an annealing process may be performed to convert the metal contact patterns 33P, 33B and 33C to first, second and third metal silicide regions 35P, 35B, and 35C.

In some embodiments, the gate pad insulating pattern 41 may be omitted, and the first metal silicide region 35P may be formed on the entire lower surface of the metal pad region 37P and may contact the entire upper surface of the gate pad portion 32P, as illustrated in FIGS. 2A and 2B.

Figure 11A:
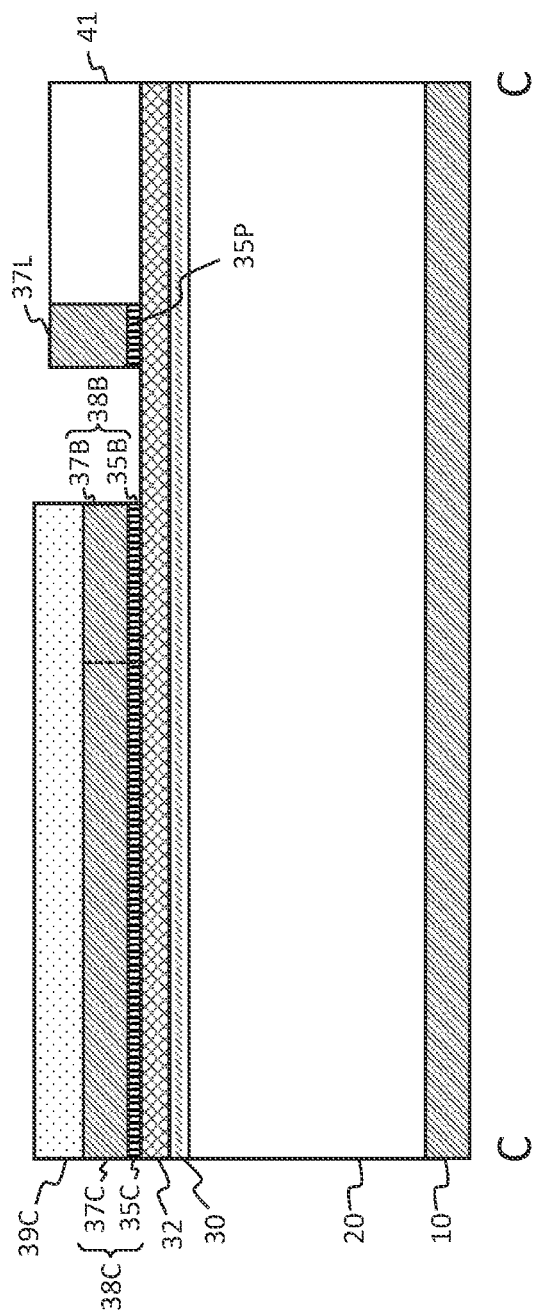
Figure 11B:
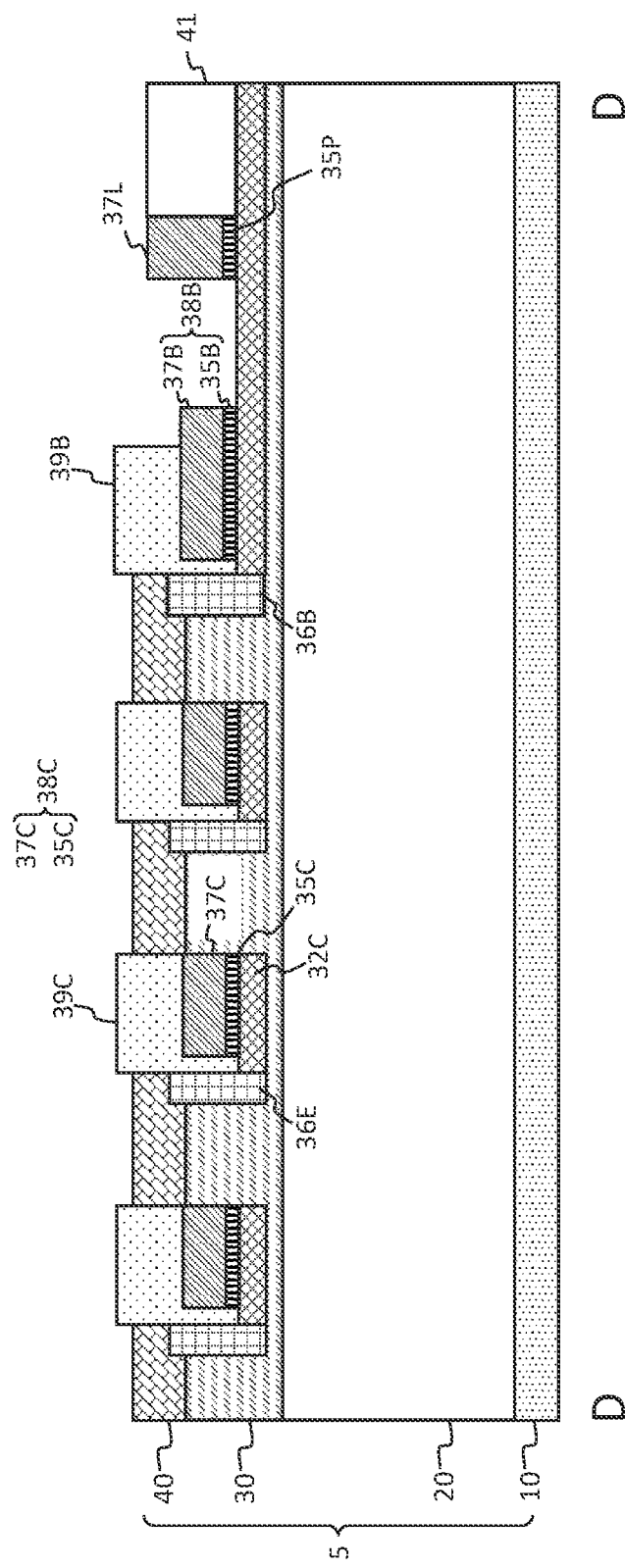

Referring to FIGS. 5, 11A and 11B, gate insulating patterns 39B and 39C may be formed on the metal gate bus 38B and the metal gate contact 38C, respectively (Block 160). The gate insulating pattern 39B may be formed in the first trench 31F, and the gate insulating patterns 39C may be formed in the second trenches 31S, respectively. In some embodiments, the portion of the metal contact pattern 33P and a portion of the metal region 37L formed on the gate pad insulating pattern 41 may be removed, thereby exposing an upper surface of the gate pad insulating pattern 41.

Figure 12A:
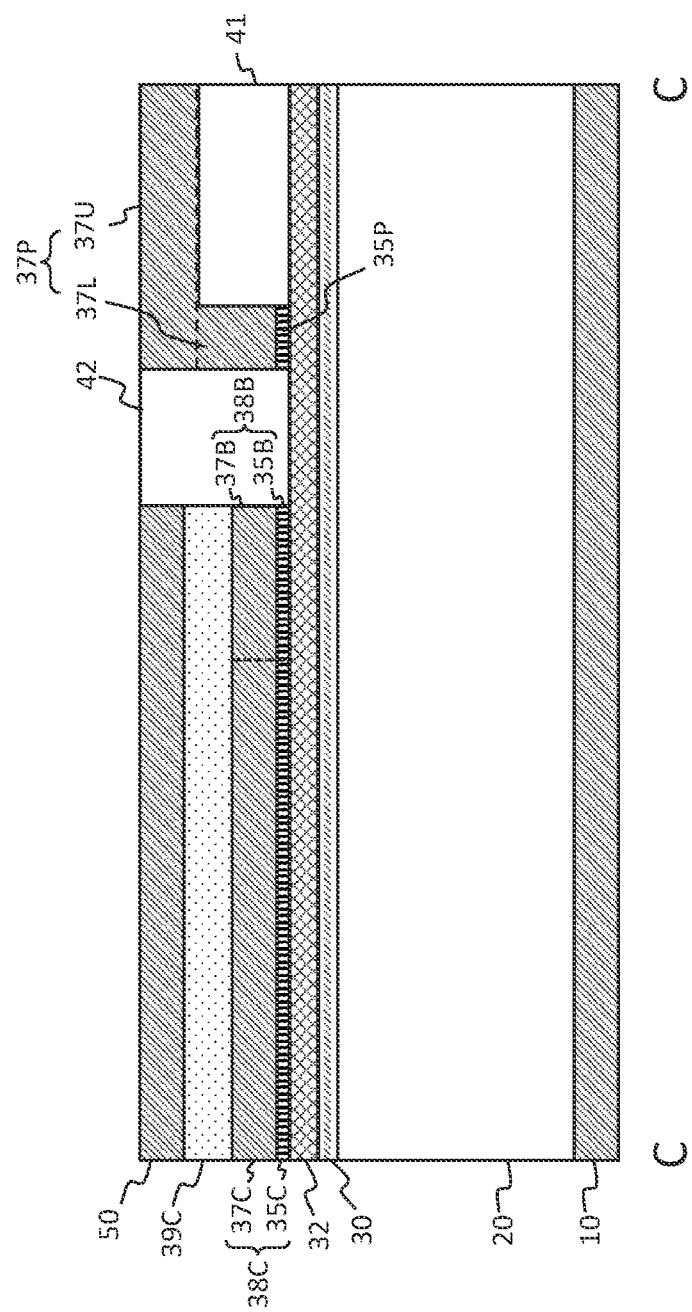
Figure 12B:
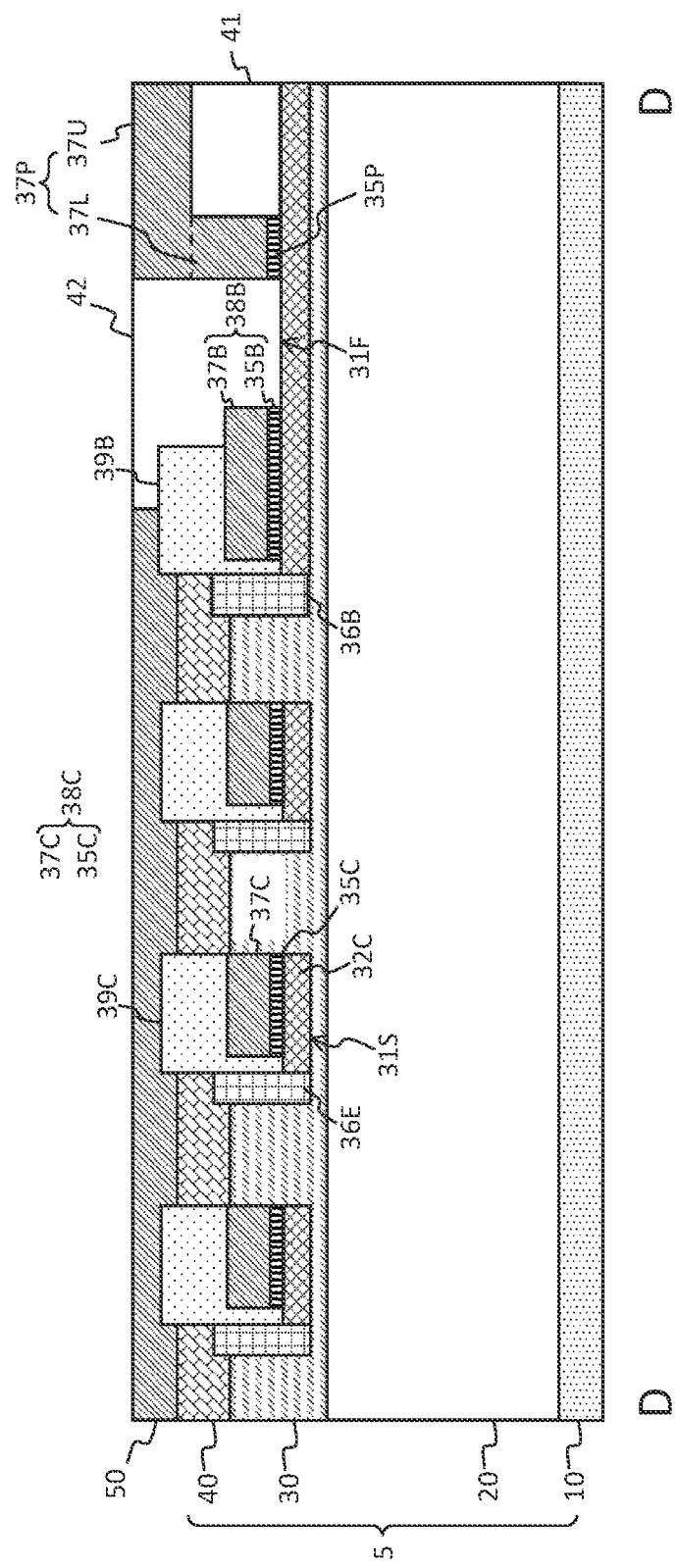

Referring to FIGS. 5, 12A and 12B, a source contact 50 and an insulating pattern 42 may be formed (Block 170). The source contact 50 may be formed on the gate insulating patterns 39B and 39C. In some embodiments, an upper portion 37U of the metal pad region 37P may be formed on the gate pad insulating pattern 41 while forming the source contact 50. The insulating pattern 42 may be formed between the metal pad region 37P and the source contact 50.

Figure 13:
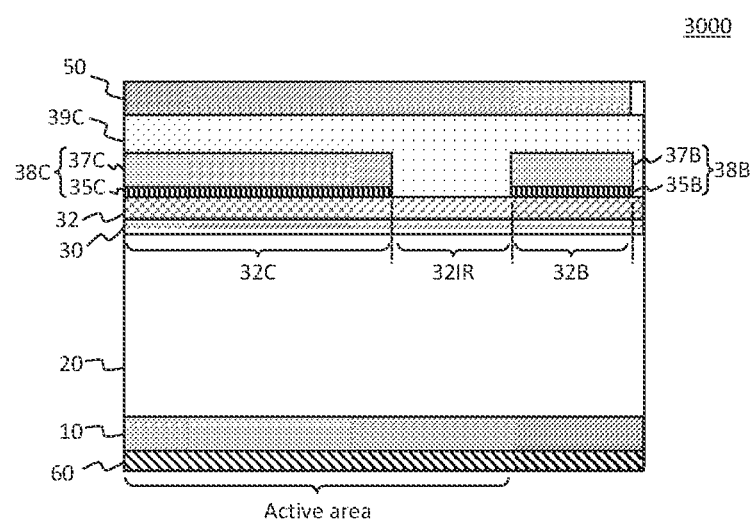
FIG. 13 is a schematic cross-sectional diagram of a power semiconductor device according to embodiments of the present invention.

FIG. 13 is a schematic cross-sectional diagram of a portion of a power semiconductor device 3000, taken along a gate length direction, according to some embodiments of the present invention. Referring to FIG. 13, the power semiconductor device 3000 may include an inter-gate resistor 3218 that is electrically interposed between the gate bus and the gate (e.g., between the metal gate bus 38B and the metal gate contact 38C). An upper surface of the inter-gate resistor 3218 may be devoid of a silicide region. The metal gate bus 38B and the metal gate contact 38C, which have a resistance lower than that of the wide band-gap semiconductor material region 32, are spaced apart from each other, and thus a current flowing between the gate bus and the gate may be forced to flow through the inter-gate resistor 321R.

The power semiconductor device 3000 includes multiple metal gate contacts 38C and multiple inter-gate resistors 321R. Each of inter-gate resistors 321R is electrically interposed between the gate bus and one of the metal gate contacts 38C. In some embodiments, all metal gate contacts 38C of the device are electrically connected to the metal gate bus 38B through respective inter-gate resistors 321R. In other embodiments, a group of the metal gate contacts 38C contact the metal gate bus 38B and are electrically connected to the metal gate bus 38B without inter-gate resistors therebetween.

The inter-gate resistor 321R may be formed by processes similar to those described with reference to FIGS. 9A to 10B. A metal contact layer and a metal layer may be formed on the gate contact portion 32C, the gate bus portion 32B and the inter-gate resistor 321R and then a portion of the metal contact layer and a portion of the metal layer formed on the inter-gate resistor 321R may be removed, thereby exposing an upper surface of the inter-gate resistor 321R. After then, an annealing process may be performed to covert portions of the metal contact layer to second and third metal silicide regions 35B and 35C that are spaced apart from each other. As the portion of the metal contact layer formed on the inter-gate resistor 321R is removed before performing the annealing process, a metal silicide may not be formed on the inter-gate resistor 321R during the annealing process, and an upper surface of the inter-gate resistor 321R may be devoid of a metal silicide.

Figure 14:
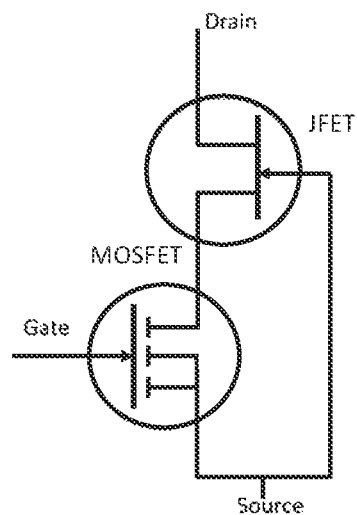
FIG. 14 is a circuit diagram of a circuit breaker including a power JFET cascoded with a MOSFET.

FIG. 14 is a circuit diagram of a circuit breaker including a power JFET cascoded with a MOSFET. The MOSFET may be a normally-off MOSFET. It may be desirable to increase the gate resistance of the power JFET to reduce and mitigate the effects of high voltage spikes including the electromagnetic interference ("EMI"), crosstalk and potential device damage. The gate resistor (the gate resistor 32R in FIG. 2A) according to some embodiments of the present invention can increase the gate resistance of the power JFET.

As discussed above, a gate resistor according to some embodiments of the present invention may be integrated around a gate pad, and thus avalanche current may bypass the gate resistor and may flow exclusively under the gate pad under avalanche conditions. Accordingly, avalanche current may not de-bias the gate voltage to the same extent as with an external gate resistor, and thus the tendency for the channel to turn-on may be reduced.

In some embodiments, a gate pad may include a narrow silicide region along an outer portion of the gate pad. Consequently, an inner portion of the gate pad, which corresponds to most of the gate pad area, may be devoid of a silicide region as discussed with reference to FIGS. 3, 4A and 4B. In those embodiments, avalanche current across most of the gate pad area may flow through an un-silicided wide band-gap semiconductor material region (e.g., the gate pad portion 32P in FIG. 4A) with the same sheet resistance as that in the gate resistor before reaching the metal gate pad, and thus the extent of diversion of avalanche current from the active area to the gate pad may be reduced. Accordingly, avalanche capability may be improved.

While the semiconductor devices discussed above are n-type devices, it will be appreciated that in p-type devices these locations are reversed. Moreover, while the above-described power semiconductor devices and the other devices described herein are shown as being silicon carbide-based semiconductor devices, it will be appreciated that embodiments of the present invention are not limited thereto. Instead, the semiconductor devices may comprise any wide bandgap semiconductor that is suitable for use in power semiconductor devices including, for example, gallium nitride-based semiconductor devices, gallium nitride-based semiconductor devices and II-VI compound semiconductor devices.

The invention has been described above with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout, except where expressly noted.

It will be understood that although the terms first and second are used herein to describe various regions, layers and/or elements, these regions, layers and/or elements should not be limited by these terms. These terms are only used to distinguish one region, layer or element from another region, layer or element. Thus, a first region, layer or element discussed below could be termed a second region, layer or element, and similarly, a second region, layer or element may be termed a first region, layer or element without departing from the scope of the present invention.

Relative terms, such as "lower" or "bottom" and "upper" or "top," may be used herein to describe one element's relationship to another element as illustrated in the drawings. It will be understood that relative terms are intended to encompass different orientations of the device in addition to the orientation depicted in the drawings. For example, if the device in the drawings is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above"

the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including," when used herein, specify the presence of stated features, elements, and/or components, but do not preclude the presence or addition of one or more other features, elements, components, and/or groups thereof.

Embodiments of the invention are described herein with reference to cross-sectional illustrations that are schematic illustrations. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the invention.

It will be understood that the embodiments disclosed herein can be combined. Thus, features that are pictured and/or described with respect to a first embodiment may likewise be included in a second embodiment, and vice versa.

While the above embodiments are described with reference to particular figures, it is to be understood that some embodiments of the present invention may include additional and/or intervening layers, structures, or elements, and/or particular layers, structures, or elements may be deleted. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A semiconductor device comprising:
a gate pad;
a gate bus; and
a gate resistor electrically interposed between the gate pad and the gate bus and comprising a wide band-gap semiconductor material region that has an insulating layer formed directly on an upper surface of the wide band-gap semiconductor material region.

2. The semiconductor device of claim 1, wherein the gate resistor has a first conductivity type and is a first portion of a semiconductor layer structure, the semiconductor layer structure further comprising a second portion that has a second conductivity type,
the gate pad comprises a metal gate pad, and the gate bus comprises a metal gate bus, and
the gate resistor electrically connects the metal gate pad to the metal gate bus.

3. A semiconductor device comprising:
a metal gate pad;
a metal gate bus; and
a gate resistor comprising a wide band-gap semiconductor material region that has a first conductivity type, the gate resistor electrically connecting the gate pad to the gate bus, where the gate resistor is a first portion of a semiconductor layer structure, the semiconductor layer structure further comprising a second portion that has a second conductivity type,
wherein the wide band-gap semiconductor material region further comprises a first portion having the first conductivity type that is in between the metal gate pad and the second portion of the semiconductor layer structure and a second portion having the first conductivity type that is in between the metal gate bus and the second portion of the semiconductor layer structure.

4. The semiconductor device of claim 3, wherein the metal gate pad comprises a first metal silicide region, the metal gate bus comprises a second metal silicide region, and the first and second metal silicide regions contact the first and second portions of the wide band-gap semiconductor material region, respectively, and
the gate resistor comprises a third portion of the wide band-gap semiconductor material region, which is between the first and second portions of the wide band-gap semiconductor material region, and an upper surface of the gate resistor is devoid of a metal silicide.

5. The semiconductor device of claim 4, wherein the first metal silicide region extends along a perimeter of a lower surface of the metal gate pad and defines an outer portion of the lower surface of the metal gate pad, and
the lower surface of the metal gate pad further comprises an inner portion that abuts the first metal silicide region and is devoid of a metal silicide.

6. The semiconductor device of claim 5, further comprising a gate pad insulating pattern that is between the inner portion of the metal gate pad and the semiconductor layer structure.

7. The semiconductor device of claim 1, wherein the wide band-gap semiconductor material region comprises silicon carbide.

8. A semiconductor device comprising:
a gate pad;
a gate bus; and
a gate resistor electrically interposed between the gate pad and the gate bus and comprising a wide band-gap semiconductor material region,
wherein the wide band-gap semiconductor material region is a portion of a semiconductor layer structure that comprises an active area comprising a plurality of junction field effect transistors (JFETs), and
wherein the semiconductor device is cascoded with a metal-oxide-semiconductor field-effect transistor (MOSFET) to form a circuit breaker.

9. The semiconductor device of claim 1, wherein the wide band-gap semiconductor material region has sheet resistance in a range of about 14000 ohms/sq to about 22000 ohms/sq.

10. A semiconductor device comprising:
a semiconductor layer structure comprising an active area that comprises a plurality of junction field effect transistors (JFETs);
a first silicide region and a second silicide region on an upper surface of the semiconductor layer structure;
a metal gate pad on the first silicide region;
a metal gate bus on the second silicide region; and electrically connected to the plurality of JFETs;
wherein the semiconductor layer structure further comprises a gate resistor that is electrically interposed between the metal gate pad and the metal gate bus, wherein an upper surface of the gate resistor is free of silicide.

11. The semiconductor device of claim 10, wherein the gate resistor comprises a wide band-gap semiconductor material region.

12. The semiconductor device of claim 11, wherein the wide band-gap semiconductor material region is a first wide band-gap semiconductor material region having a first conductivity type, and the semiconductor layer structure further comprises a plurality of second wide band-gap semiconductor material regions having the first conductivity type, and
wherein the plurality of JFETs comprise, respectively, a plurality of metal gate contacts and a plurality of gate electrodes, and each of the plurality of gate electrodes comprises a respective one of the plurality of second wide band-gap semiconductor material regions and contacts a lower surface of a respective one of the plurality of metal gate contacts.

13. The semiconductor device of claim 10, wherein the semiconductor device is cascoded with a metal-oxide-semiconductor field-effect transistor (MOSFET) to form a circuit breaker.

14. The semiconductor device of claim 10, wherein the gate resistor comprises a wide band-gap semiconductor material region having a first conductivity type and is a first portion of the semiconductor layer structure, and the semiconductor layer structure further comprises a second portion having a second conductivity type, and
the wide band-gap semiconductor material region further comprises a first portion between the metal gate pad and the second portion of the semiconductor layer structure and a second portion between the metal gate bus and the second portion of the semiconductor layer structure.

15. The semiconductor device of claim 14, wherein the metal gate pad comprises a first metal silicide region, the metal gate bus comprises a second metal silicide region, and the first and second metal silicide regions contact the first and second portions of the wide band-gap semiconductor material region, respectively, and
wherein the gate resistor comprises a third portion of the wide band-gap semiconductor material region that is between the first and second portions of the wide band-gap semiconductor material region, and an upper surface of the third portion of the wide band-gap semiconductor material region is devoid of a metal silicide.

16. The semiconductor device of claim 15, wherein the first metal silicide region extends along a perimeter of a lower surface of the metal gate pad and defines an outer portion of the lower surface of the metal gate pad, and
the lower surface of the metal gate pad further comprises an inner portion that abuts the first metal silicide region and is devoid of a metal silicide.

17. The semiconductor device of claim 16, further comprising a gate pad insulating pattern that is between the inner portion of the lower surface of the metal gate pad and the semiconductor layer structure.

18. The semiconductor device of claim 10, wherein the gate resistor comprises a wide band-gap semiconductor region having sheet resistance in a range of about 14000 ohms/sq to about 22000 ohms/sq.

19. The semiconductor device of claim 10, wherein the gate resistor comprises a wide band-gap semiconductor region having sheet resistance of about 18000 ohms/sq.

* * * * *

UNITED STATES PATENT AND TRADEMARK OFFICE
CERTIFICATE OF CORRECTION

PATENT NO. : 12,446,300 B2
APPLICATION NO. : 17/847410
DATED : October 14, 2025
INVENTOR(S) : Potera et al.

It is certified that error appears in the above-identified patent and that said Letters Patent is hereby corrected as shown below:

In the Specification

Column 8, Line 35: Please correct "(e.g., 15.5 ohms to about ohms)" to read --(e.g., 15.5 ohms to about 20.5 ohms)--

Column 8, Line 41: Please correct "a drift region a" to read --a drift region 20, a--

Column 8, Line 51: Please correct "(n)" to read --(n⁻)--

Column 8, Line 52: Please correct "(n)" to read --(n-)--

Column 9, Line 8: Please correct "source regions may" to read --source regions 40 may--

Column 9, Line 26: Please correct "region and" to read --region 30 and--

Column 9, Line 41: Please correct "substrate as" to read --substrate 10 as--

Column 10, Line 32: Please correct "and may" to read --and 35C may--

Column 13, Line 8: Please correct "3218" to read --32IR--

Column 13, Line 11: Please correct "3218" to read --32IR--

Column 13, Line 16: Please correct "321R" to read --32IR--

Column 13, Line 19: Please correct "321R" to read --32IR--

Signed and Sealed this
Third Day of February, 2026

John A. Squires
*Director of the United States Patent and Trademark Office*

CERTIFICATE OF CORRECTION (continued)
U.S. Pat. No. 12,446,300 B2

Column 13, Line 19: Please correct "321R" to read --32IR--

Column 13, Line 23: Please correct "321R" to read --32IR--

Column 13, Line 28: Please correct "321R" to read --32IR--

Column 13, Line 32: Please correct "321R" to read --32IR--

Column 13, Line 34: Please correct "321R" to read --32IR--

Column 13, Line 35: Please correct "321R" to read --32IR--

Column 13, Line 40: Please correct "321R" to read --32IR--

Column 13, Line 42: Please correct "321R" to read --32IR--

Column 13, Line 43: Please correct "321R" to read --32IR--